US012667030B2

(12) United States Patent
Ory et al.

(10) Patent No.: US 12,667,030 B2
(45) Date of Patent: Jun. 23, 2026

(54) ELECTRONIC CHIPS INCLUDING J-SHAPED SUBSTRATE SIDEWALLS

(71) Applicant: STMICROELECTRONICS (TOURS) SAS, Tours (FR)

(72) Inventors: Olivier Ory, Tours (FR); Michael De Cruz, Monnaie (FR)

(73) Assignee: STMICROELECTRONICS (TOURS) SAS, Tours (FR)

( * ) Notice: Subject to any disclaimer, the term of this patent is extended or adjusted under 35 U.S.C. 154(b) by 673 days.

(21) Appl. No.: 17/744,397

(22) Filed: May 13, 2022

(65) Prior Publication Data

US 2022/0375840 A1 Nov. 24, 2022

(30) Foreign Application Priority Data

May 18, 2021 (FR) ...................................... 2105176

(51) Int. Cl.
*H10W 90/00* (2026.01)
*H10W 70/65* (2026.01)
(Continued)

(52) U.S. Cl.
CPC ......... *H10W 90/701* (2026.01); *H10W 70/65* (2026.01); *H10W 70/69* (2026.01);
(Continued)

(58) Field of Classification Search
CPC ......... H01L 23/49816; H01L 23/49838; H01L 23/49894; H01L 23/3114; H01L 23/3135; H01L 23/488; H01L 24/16; H01L 24/02; H01L 2224/11554; H01L 2224/11632; H01L 2224/16054; H01L 2224/16059;

H01L 2224/291; H01L 2224/32058; H01L 2224/32227; H01L 2224/94; H01L 2924/10156; H10W 90/701; H10W 90/734; H10W 70/65; H10W 70/69; H10W 70/652; H10W 70/655; H10W 70/66; H10W 72/232; H10W 72/234; H10W 72/334; H10W 72/352; H10W 72/59;
(Continued)

(56) References Cited

U.S. PATENT DOCUMENTS 4,640,721 A 2/1987 Uehara et al.
5,428,248 A 6/1995 Cha
(Continued)

FOREIGN PATENT DOCUMENTS

CN 1812075 A 8/2006
CN 1835196 A 9/2006
(Continued)

OTHER PUBLICATIONS

Ganjei, John, "Improved QFN Reliability by Flank Tin Plating Process after Singulation," 10th International Microsystems, Packaging, Assembly and Circuits Technology Conference, 2015, 4 pages.
(Continued)

*Primary Examiner* — Ida M Soward
(74) *Attorney, Agent, or Firm* — Seed IP Law Group LLP

(57) ABSTRACT

An electronic chip including a semiconductor substrate carrying at least one metal contact extending, within the thickness of the substrate, along at least one flank of the chip.

19 Claims, 14 Drawing Sheets

(51) Int. Cl.
| | | |
|---|---|---|
| *H10W 70/69* | (2026.01) | |
| *H10W 72/00* | (2026.01) | |
| *H10W 72/20* | (2026.01) | |

(52) U.S. Cl.
CPC ............................ *H10W 72/01251* (2026.01); *H10W 72/01261* (2026.01); *H10W 72/07253* (2026.01); *H10W 72/232* (2026.01); *H10W 72/234* (2026.01)

(58) Field of Classification Search
CPC ............. H10W 72/922; H10W 72/932; H10W 72/934; H10W 72/941; H10W 72/9445; H10W 72/852; H10W 72/20; H10W 74/141; H10W 74/129; H10W 74/121
See application file for complete search history.

(56) References Cited

U.S. PATENT DOCUMENTS

| | | | |
|---|---|---|---|
| 5,606,198 | A | 2/1997 | Ono et al. |
| 5,770,888 | A | 6/1998 | Song et al. |
| 5,910,687 | A * | 6/1999 | Chen ...................... H01L 23/481 257/784 |
| 5,998,877 | A | 12/1999 | Ohuchi |
| 6,326,689 | B1 | 12/2001 | Thomas |
| 6,498,099 | B1 | 12/2002 | McLellan et al. |
| 7,935,568 | B2 | 5/2011 | Oganesian et al. |
| 8,278,213 | B2 | 10/2012 | Kameyama et al. |
| 8,551,815 | B2 | 10/2013 | Avsian et al. |
| 9,177,836 | B1 | 11/2015 | Liu et al. |
| 11,393,785 | B2 | 7/2022 | Fallourd et al. |
| 2003/0067001 | A1 | 4/2003 | Poo et al. |
| 2005/0095750 | A1 | 5/2005 | Lo et al. |
| 2006/0012967 | A1 | 1/2006 | Asai et al. |
| 2006/0170112 | A1 | 8/2006 | Tanaka et al. |
| 2007/0026567 | A1 | 2/2007 | Beer et al. |
| 2007/0096295 | A1 | 5/2007 | Burtzlaff et al. |
| 2008/0315407 | A1 * | 12/2008 | Andrews, Jr. ....... H01L 25/0657 257/777 |
| 2009/0243097 | A1 | 10/2009 | Koroku et al. |
| 2010/0001305 | A1 * | 1/2010 | Lin .................... H10H 20/8506 257/E33.059 |
| 2010/0246152 | A1 | 9/2010 | Lin et al. |
| 2011/0018116 | A1 | 1/2011 | Feng |
| 2011/0042799 | A1 | 2/2011 | Kang et al. |
| 2011/0133333 | A1 * | 6/2011 | Kwon ................... H01L 23/481 257/E21.585 |
| 2011/0189822 | A1 | 8/2011 | Sasaki et al. |
| 2011/0207323 | A1 * | 8/2011 | Ditizio ............. H01L 21/02271 257/E21.597 |
| 2011/0274299 | A1 | 11/2011 | Shaw et al. |
| 2011/0304008 | A1 | 12/2011 | Yang |
| 2012/0034760 | A1 | 2/2012 | Schuderer et al. |
| 2012/0178251 | A1 | 7/2012 | Lim et al. |
| 2012/0282735 | A1 | 11/2012 | Ahn et al. |
| 2013/0161813 | A1 | 6/2013 | Miki |
| 2013/0267124 | A1 | 10/2013 | Chang et al. |
| 2014/0054796 | A1 | 2/2014 | Gong et al. |
| 2015/0007939 | A1 | 1/2015 | Sherrer et al. |
| 2015/0228557 | A1 | 8/2015 | Cheng et al. |
| 2015/0255349 | A1 | 9/2015 | Holden et al. |
| 2015/0269472 | A1 | 9/2015 | Finn et al. |
| 2016/0172275 | A1 | 6/2016 | Marchisi |
| 2017/0025356 | A1 | 1/2017 | Xue |
| 2017/0077022 | A1 | 3/2017 | Scanlan et al. |
| 2017/0084686 | A1 | 3/2017 | Wang et al. |
| 2017/0222019 | A1 | 8/2017 | Wang et al. |
| 2017/0271246 | A1 | 9/2017 | Macheiner et al. |
| 2017/0316957 | A1 | 11/2017 | Chen et al. |
| 2017/0323840 | A1 | 11/2017 | Chiu et al. |
| 2017/0373042 | A1 * | 12/2017 | Shizukuishi .............. G01T 7/00 |
| 2018/0005912 | A1 | 1/2018 | Oh et al. |
| 2018/0008920 | A1 | 1/2018 | Peterson, II et al. |
| 2018/0033781 | A1 | 2/2018 | Zhou et al. |
| 2018/0068920 | A1 | 3/2018 | Leung et al. |
| 2018/0204780 | A1 | 7/2018 | Chiu et al. |
| 2018/0269138 | A1 | 9/2018 | Villamor et al. |
| 2018/0330966 | A1 | 11/2018 | Scanlan et al. |
| 2018/0342453 | A1 | 11/2018 | Ziglioli |
| 2019/0244853 | A1 | 8/2019 | Berger et al. |
| 2019/0265118 | A1 * | 8/2019 | Tu ......................... G01L 19/143 |
| 2020/0126877 | A1 | 4/2020 | Takaoka |
| 2021/0175094 | A1 | 6/2021 | De Cruz et al. |
| 2021/0175203 | A1 | 6/2021 | Fallourd et al. |
| 2022/0302013 | A1 | 9/2022 | Pyun et al. |
| 2022/0344303 | A1 | 10/2022 | Fallourd et al. |
| 2023/0068222 | A1 | 3/2023 | Ory et al. |
| 2023/0178380 | A1 | 6/2023 | De Cruz et al. |
| 2025/0192022 | A1 | 6/2025 | Delacourt |

FOREIGN PATENT DOCUMENTS

| | | | |
|---|---|---|---|
| CN | 103364455 | A | 10/2013 |
| CN | 104022043 | A | 9/2014 |
| CN | 105374762 | A | 3/2016 |
| CN | 107134438 | A | 9/2017 |
| CN | 107808871 | A | 3/2018 |
| CN | 108807197 | A | 11/2018 |
| CN | 110943041 | A | 3/2020 |
| CN | 112908935 | A | 6/2021 |
| CN | 219226269 | U | 6/2023 |
| EP | 1085570 | A2 | 3/2001 |
| EP | 3154085 | A1 | 4/2017 |
| EP | 3211670 | A1 | 8/2017 |
| EP | 3282476 | A1 | 2/2018 |
| JP | 2009076839 | A | 4/2009 |
| KR | 20030008646 | A | 1/2003 |
| KR | 100595885 | B1 | 6/2006 |
| WO | WO 2020250660 | A1 | 12/2020 |

OTHER PUBLICATIONS

2021/0175094, filed Jun. 10, 2021.
U.S. Appl. No. 17/811,560, filed Jul. 8, 2022.
U.S. Appl. No. 17/744,397, filed Aug. 26, 2022.

* cited by examiner

A.

A                                                                    A

17

13          19          19

B.

B                                                                    B

19

17

13          19

17

15

11

21

19

13

A.

B.

A.

B.

C.

A.

B.

A.

B.

A.

B.

C.

ELECTRONIC CHIPS INCLUDING J-SHAPED SUBSTRATE SIDEWALLS

BACKGROUND

Technical Field

The present disclosure relates to the manufacture of electronic chips. More particularly, it is directed to the manufacture of so-called surface mounted chips, i.e., including, on the side of at least one face, one or more metallized connections intended to be soldered to corresponding connection pads of an external device, for example a printed circuit board or another chip.

Description of the Related Art

In some situations, there is a need for surface mounted chips in which the metallized connections destined to be soldered to an external device extend to the flanks of the chips. These are called wettable flank chips. When the chip is mounted in its environment (for example, on a printed circuit board), the metallized connections are soldered or brazed to corresponding metal tracks or elements on the printed circuit side. A part of the soldering material then rises on the flanks of the chip, which allows visual inspection of the quality of the connections to be implemented. This need exists, for example, in the automotive or medical domain and, more generally, in domains where a guarantee of reliability of electrical connections is sought after, once the circuits are mounted in their environment.

It would be desirable to improve at least in part certain aspects of the known methods for manufacturing electronic chips with wettable flanks.

BRIEF SUMMARY

There is a need for improvement in known microchips and their manufacturing method.

One embodiment addresses all or some of the drawbacks of known electronic chips and their manufacturing method.

One embodiment provides for an electronic chip comprising a semiconductor substrate carrying at least one metal contact extending, within the thickness of the substrate, along at least one flank of the chip.

Another embodiment provides for a method of manufacturing an electronic chip including at least one step of forming at least one metal contact extending, within the thickness of a semiconductor substrate, along at least one flank of the chip.

According to one embodiment, the metal contact is flush with an upper face of the chip, the said face being flat.

According to one embodiment, the chip is only covered with the metal contact(s) and an insulating protective resin (s).

According to one embodiment, the metal contact extends along at least one flank of the chip over a height of between 50 μm and 200 μm, preferably of the order of 100 μm.

According to one embodiment, the metal contacts are made of a tin-based alloy.

According to one embodiment, a lower face of the substrate is coated with an electrically insulating protective resin.

According to one embodiment, the metal contact is, within the thickness of the substrate, separated from the substrate by an insulation layer.

According to one embodiment, the chip presents the shape of a parallelepiped comprising, at least at the level of the metal contacts, a shoulder in the height of the chip.

According to one embodiment, the metal contact extends continuously over at least a portion of an upper face of the chip, over at least a portion of a side face of the chip, and over at least a portion of a face of the shoulder, parallel to the upper face.

According to one embodiment, the method comprises at least the following steps:

a1) forming, on the side of an upper face of the semiconductor substrate, in and on which a plurality of integrated circuits have been previously formed, the first openings laterally separating the integrated circuits;

b1) depositing, in the first openings and on a portion of the upper face of the substrate, a layer of a metallic material;

c1) forming, in line with the metal layer, bumps. The bumps covering the metal layer and at least two metallic contact connection pads of two adjacent integrated circuits formed in the same substrate;

d1) forming, from the upper face of the substrate, first trenches so as to individualize each integrated circuit, the first trenches intersecting the bumps and extending over a width less than or equal to the width of the first openings and over a depth greater than the depth of the first openings;

e1) depositing an electrically insulating protective resin in the first trenches and over the entire upper face of the substrate;

f1) thinning the substrate by its upper face so as to remove a part of the protective insulating resin and a part of the bumps;

g1) thinning the substrate from its lower face until reaching the protective insulating resin located at the bottom of the first trenches;

h1) forming second openings from the upper face of the substrate in line with the first openings; and i1) cutting the protective resin in line with the first trenches, so as to separate the integrated circuits into individual chips with a width less than the width of the first trenches.

According to one embodiment, in step h1), what remains of the bumps and the metal layer is cut through the second openings so as to form the metal contacts.

According to one embodiment, in step b1) the metal layer is molded into the first openings.

According to one embodiment, the filling of the first openings with the metal layer in step b1) is performed by an electroplating method.

According to one embodiment, the first openings and the second openings are made by laser ablation or sawing.

According to one embodiment, the chip comprises six planar faces organized in a parallelepiped, the chip comprising at least one metal contact forming an angle between two consecutive faces of the parallelepiped, the contact extending over a portion of the thickness of the substrate.

According to one embodiment, the method comprises the following steps:

a2) forming, on the side of an upper face of the semiconductor substrate, in and on which a plurality of integrated circuits have been previously formed, first openings laterally separating integrated circuits;

b2) depositing, in the first openings, a layer of a photosensitive resin;

c2) forming second openings locally in the photosensitive resin layer in the first openings over only a portion of the thickness of the photosensitive resin layer;

d2) depositing, in the second openings, a layer of a metallic material;

e2) forming bumps in line with the metal layer, the bumps covering the metal layer and at least two contact connection pads of two adjacent integrated circuits formed in the same substrate;

f2) removing the photosensitive resin layer throughout the structure and filling in the gaps left by a layer of a protective insulating resin;

g2) thinning the substrate from its upper face so as to remove a part of the protective insulating resin layer and a part of the bumps so as to form the metal contacts;

h2) thinning the substrate from its lower face to reach the protective insulating resin at the bottom of the first openings; and i2) depositing on the lower face of the substrate a further layer of protective insulating resin and cutting the protective insulating resin and the metal contacts opposite the first openings to a width less than the width of the first openings, so as to separate the integrated circuits into individual chips and to expose one flank of at least one metal contact of each integrated circuit.

According to one embodiment, the cutting in step i2) is performed by sawing.

According to one embodiment, the first openings are made by laser ablation or by sawing.

According to one embodiment, the second openings are made by photolithography or by laser ablation.

BRIEF DESCRIPTION OF THE SEVERAL VIEWS OF THE DRAWINGS

The foregoing features and advantages, as well as others, will be described in detail in the following description of specific embodiments given by way of illustration and not limitation with reference to the accompanying drawings, in which.

DETAILED DESCRIPTION

Figure 1:
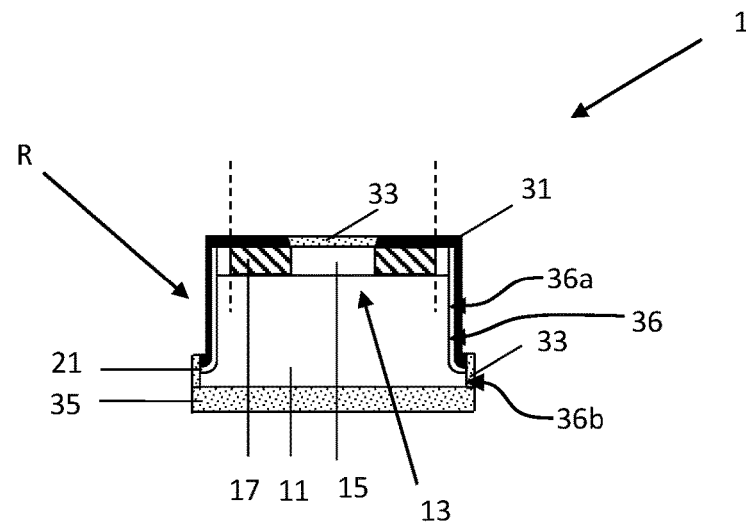
FIG. 1 illustrates, by means of a cross-sectional view, a first embodiment of an electronic chip.

Like features have been designated by like references in the various figures. In particular, the structural and/or functional features that are common among the various embodiments may have the same references and may dispose identical structural, dimensional, and material properties.

For the sake of clarity, only the operations and elements that are useful for an understanding of the embodiments described herein have been illustrated and described in detail. In particular, the realization of the integrated circuits present in the described electronic chips has not been detailed.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms "front," "back," "top," "bottom," "left," "right," etc., or to relative positional qualifiers, such as the terms "above," "below," "higher," "lower," etc., or to qualifiers of orientation, such as "horizontal," "vertical," etc., reference is made to the orientation shown in the figures.

Unless specified otherwise, the expressions "around," "approximately," "substantially" and "in the order of" signify within 10%, and preferably within 5%.

A wettable flank chip has metallized connections with a height sufficiently large so that the visual inspection of the chip soldering can be effective. Visual inspection of soldering is generally considered difficult when the metallizations are less than about 100 μm in height. Therefore, the metallizations preferably present a height greater than about 100 μm in the applications covered by the present description.

This height is one of the blocking points in the miniaturization of electronic circuits based on such chips. Indeed, the metallized connections are usually made on the surface of a semiconductor substrate and on top of the integrated circuit(s) that it comprises. The thickness of an electronic chip with wettable flanks thus corresponds, at a minimum, to the height of the metallizations to which is added the thickness of the substrate comprising the integrated circuit(s).

In the described embodiments, it is intended to take advantage of the thickness of the substrate by transferring a portion of the height of the metallizations into the thickness of the substrate. In other words, it is intended to extend the metallization into the thickness of the substrate along at least one flank of the chip. The described embodiments thus make it possible to decrease the thickness of the metallization at the surface of the substrate by transferring this thickness into the thickness of the substrate. This then reduces the overall thickness of the wettable flank chips.

FIG. 1 illustrates, by means of a partial schematic cross-sectional view, a first embodiment of an electronic chip 1.

The electronic chip 1 comprises a semiconductor substrate 11 in and on which one or more integrated circuits 13 are formed. The substrate 11 is made of a semiconductor material such as silicon. The substrate 11 and the integrated circuit 13 are topped by a stack of insulating and conductive layers 15 referred to as an interconnect stack or an interconnect layer, in which interconnect elements of the components of the circuit 13 may be formed. The interconnect stack or layer 15 further comprises, one or more contact connection pads 17 which may be metallic, for example two pads 17 as illustrated in FIG. 1. The contact connection pads 17 are flush with the surface of the structure formed by the substrate 11, the integrated circuit(s) 13 and the stack 15 and are intended to be connected to an external device.

The structure formed by the substrate 11, the stack 15 and the contact connection pads 17 presents a parallelepiped shape. According to the embodiment, this structure may comprise one or more lateral recesses R, or shoulders, in the height of the chip 1 which will be detailed later.

The chip 1 illustrated in FIG. 1 further comprises metal contacts 31. Each metal contact 31 is, formed on and in contact with a contact connection pad 17 and extends continuously over at least a portion of the upper face of the substrate 11 (or chip), at least one of the side flanks of the substrate 11 (or chip), and at least a portion of a face of the shoulder, parallel to the upper face. The metal contacts 31 thus extend along the substrate 11 within the thickness thereof.

According to the embodiment illustrated in FIG. 1, all of the contact connection pads 17 are covered by a metal contact 31.

As an example, in the recesses R, the metal contacts 31 are separated from the substrate 11 by an insulation layer 21.

The portions of the structure, formed by the substrate 11, the stack 15, and the contact connection pads 17, that are not covered by a metal contact 31 are covered by an insulating protective resin or resins. For example, a portion of the upper face and a portion of the side flanks of the structure are covered by a resin layer 33 and the lower face of the structure is covered by a resin layer 35.

As shown in FIG. 1, respective ends of the insulation layer 21 and of the one or more metal contacts 31 are covered by the resin layer 33. As shown in FIG. 1, a first portion 36a of a sidewall 36 of the semiconductor substrate 11 is covered by insulation layer 21, and a second portion 36b of the sidewall 36 of the semiconductor substrate 11 is covered by the resin layer 33. As shown in FIG. 1, the first portion 36a of the sidewall 36 is offset inwardly from the second portion 36b of the sidewall 36. The first portion 36a may be referred to as a first sidewall, a first sidewall portion, or some other similar or like reference to the first portion 36a of the sidewall 36. The second portion 36b may be referred to as a second sidewall, a second sidewall portion, or some other similar or like reference to the second portion 36b of the sidewall 36.

FIGS. 2 to 15 are cross-sectional and top views illustrating successive steps of an example of a method for manufacturing electronic chips according to a first embodiment.

Figure 2:
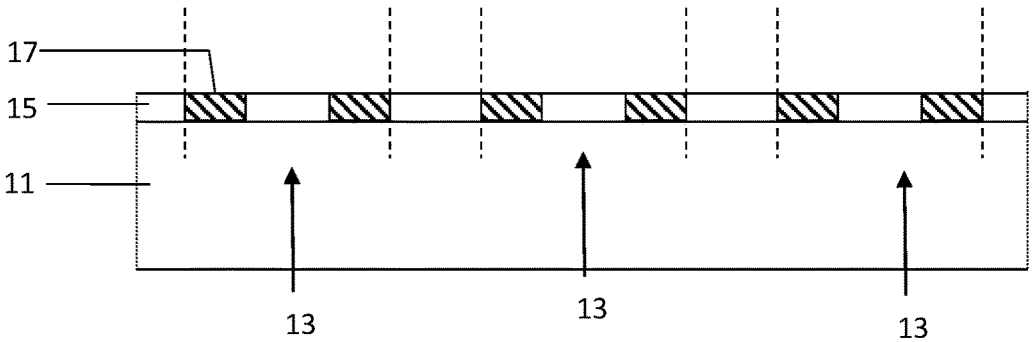
FIG. 2 illustrates, by means of a cross-sectional view, a step of an example of a method for manufacturing the electronic chip illustrated in FIG. 1.

FIG. 2 is a cross-sectional view of a starting structure comprising the semiconductor substrate 11 in and on which the integrated circuits 13 have been previously formed. The circuits 13 are, for example, all identical within manufacturing dispersions. The substrate 11 may correspond to a wafer of a semiconductor material, for example silicon. The substrate 11 presents, for example, a thickness between 300 μm and 900 μm, for example a thickness of about 500 μm.

The structure of FIG. 2 further comprises the stack of insulating and conductive layers 15 coating the upper face of the substrate 11. The interconnect stack 15 further comprises, for each integrated circuit 13, one or more contact connection pads 17. In the example shown in FIG. 2, two contact connection pads 17 are represented for each circuit 13. However, the number of contact connection pads 17 per circuit 13 may be different than two.

Each integrated circuit 13 comprises, for example, one or more electronic components (transistors, diodes, thyristors, triacs, etc.).

In FIG. 2, three integrated circuits 13 have been represented, with the understanding that the number of integrated circuits 13 formed in and on the substrate 11 may be different than three. In practice, the substrate 11 is a wafer of a semiconductor material, for example, silicon, and several tens or even several hundred integrated circuits 13 are formed in and on the substrate 11. The integrated circuits 13 are then organized in an array in rows and columns in a regular grid pattern.

In the remainder of this description, in the orientation of FIG. 2, the lower face of the structure is considered to be the rear face and the upper face of the structure is considered to be the front face.

Figure 3:
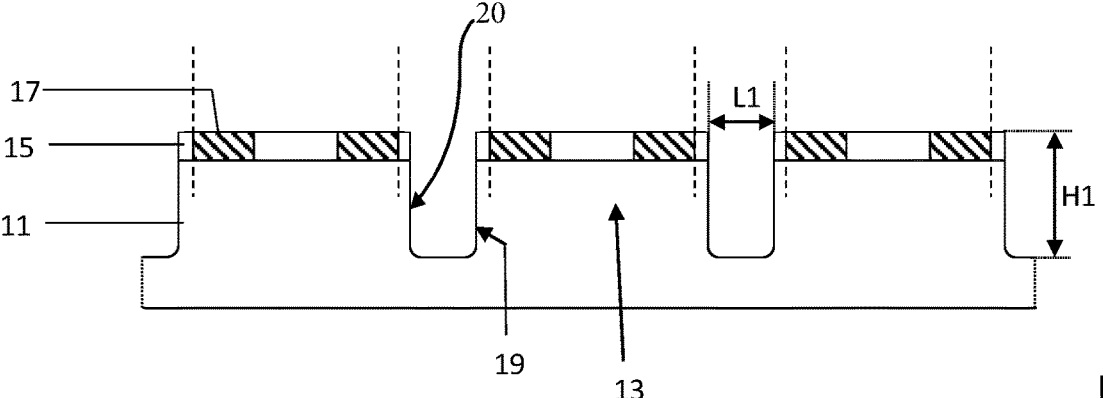
FIG. 3 illustrates, by means of a cross-sectional view, another step of an example of a method for manufacturing the electronic chip illustrated in FIG. 1.

FIG. 3 illustrates, by means of a cross-sectional view, a step a1) of forming the openings 19, in the front face of the starting structure illustrated in FIG. 2. The openings are between sidewalls 20 of the substrate 11 as shown in FIG. 3.

Figure 4:
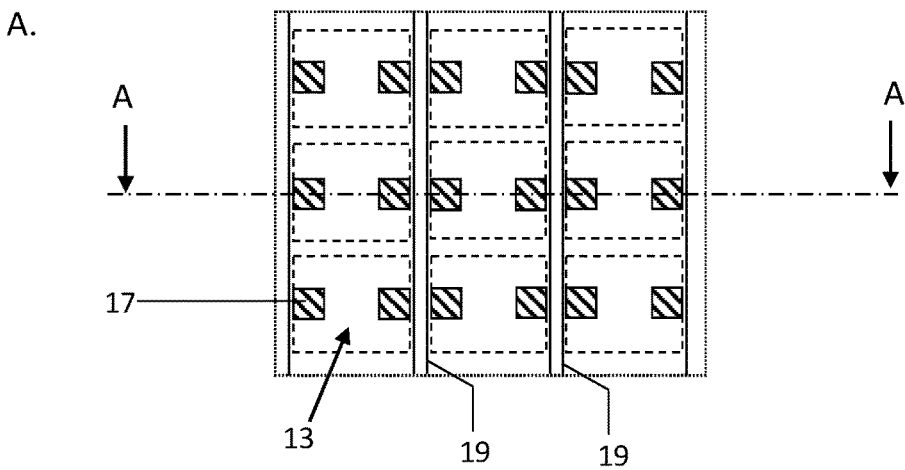
FIG. 4 illustrates, by means of two top views, two embodiments of the structure illustrated in FIG. 3.
Figure 4:
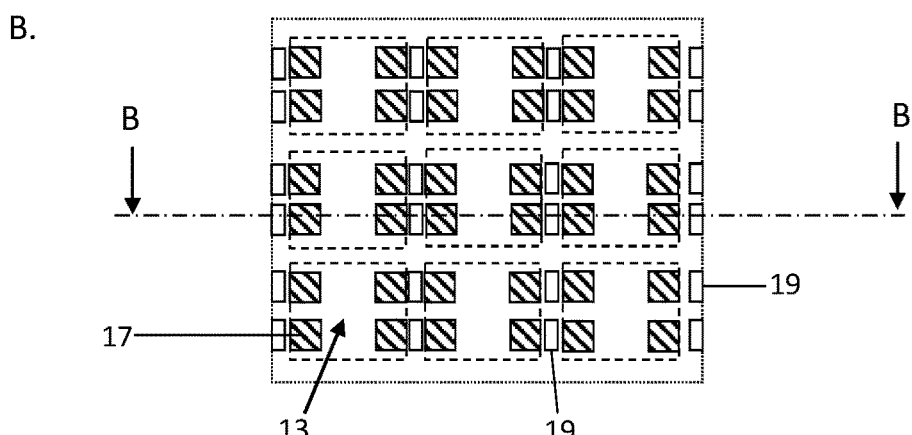

FIG. 4 illustrates, by means of two top views (A) and (B), two embodiments of the structure illustrated in FIG. 3. FIG. 3 then corresponds to a section according to the sectional plane A-A of view (A) of FIG. 4 or to a section according to the sectional plane B-B of view (B) of FIG. 4.

In the example represented, the openings 19 extend vertically from the upper face of the stack 15 and extend into the substrate 11. In this example, the openings 19 are non-through, i.e., they do not open onto the lower face of the substrate 11. The openings 19 extend vertically to a depth H1, for example between 50 μm and 200 μm, preferably of the order of 120 μm. The openings 19 present, for example, a width L1 of between 20 μm and 100 μm, preferably between 40 μm and 70 μm, with the width L1 preferably being equal to about 55 μm, for example equal to 55 μm.

According to the embodiment illustrated in view (A) of FIG. 4, the openings 19 extend between the circuits 13 such that, in plan view, each column of circuits 13 is separated from the adjacent column of circuits 13 by an opening 19. The openings 19 are formed such that they pass in the vicinity of the contact connection pads 17 of the integrated circuits 13 (for example, within 10 μm, but preferably, however, without reaching them). The openings 19 are then, for example, made by sawing or etching. In the step of forming the openings 19, the structure may be mounted on a carrier film, not represented, arranged on the lower face of the substrate 11, the film being removed after the openings 19 have been formed.

According to the embodiment illustrated in view (B) of FIG. 4, the openings 19 are formed between the circuits 13 such that there is at least one opening 19 opposite each contact connection pad 17. For example, an opening 19 may be located opposite several contact connection pads 17 of the same circuit 13 or of two adjacent circuits 13. The openings 19 are then, for example, made by laser ablation or by engraving. During the step of forming the openings 19, the structure may be mounted on a support film, not represented, arranged on the lower face of the substrate 11, the film being removed after the openings 19 are formed.

Figure 5:
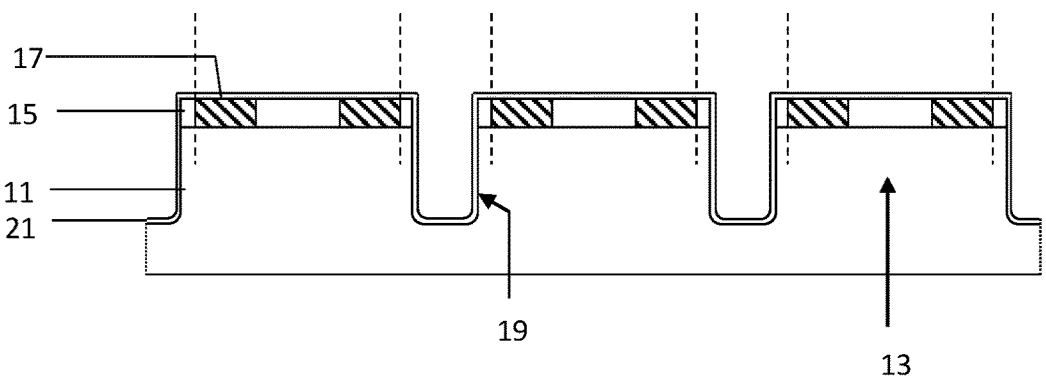
FIG. 5 illustrates, by means of a cross-sectional view, yet another step of an example of a method for manufacturing the electronic chip illustrated in FIG. 1.

FIG. 5 illustrates, by means of a cross-sectional view, a step of depositing an insulation layer 21, on the front face of the structure obtained at the end of the steps of FIGS. 2 and 3.

According to one embodiment, the layer 21 is a layer of a dielectric, for example of silicon dioxide ($SiO_2$).

According to one embodiment, the layer 21 is, for example, covered completely, i.e., the layer 21 covers the upper face of the structure obtained from the steps of FIGS. 2 and 3 as well as the side edges and the bottom of the openings 19.

According to another embodiment, the layer 21 is not covered completely and is formed locally, grown by dry or wet oxidation.

According to one embodiment, the layer 21 is, for example, between 1 μm and 6 μm thick.

According to another embodiment, on completion of the etching of the openings 19, a polymer residue remains at the bottom and on the side edges of the openings 19. This polymer can serve as an insulating layer 21.

According to another embodiment, the layer 21 is, in part, a porous silicon layer formed in the openings 19 or an insulating layer formed by deep reactive ion etching (DRIE).

Figure 6:
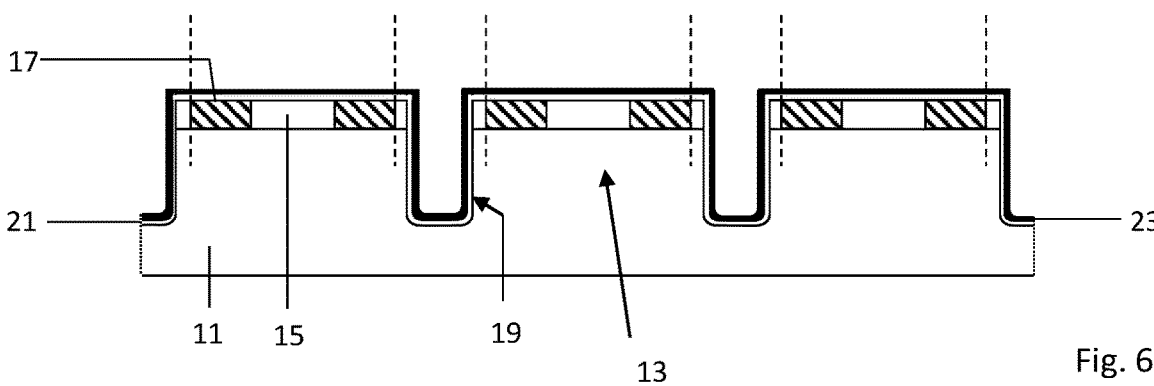
FIG. 6 illustrates, by means of a cross-sectional view, yet another step of an example of a method for manufacturing the electronic chip illustrated in FIG. 1.

FIG. 6 illustrates, by means of a cross-sectional view, a step of depositing a layer 23 of a metallic material on the front face of the structure obtained on completion of the steps of FIGS. 2 to 5.

According to the embodiment illustrated in FIG. 6, the layer 23 is a complete covering, i.e., the layer 23 covers the upper face of the structure obtained from the steps of FIGS. 2 to 5 and the side edges and the bottom of the openings 19. The layer 23 is, for example, an alloy made of copper and/or tin and/or silver or any other material suitable for brazing. As an example, layer 23 is made of a tin-silver alloy (SnAg).

Figure 7:
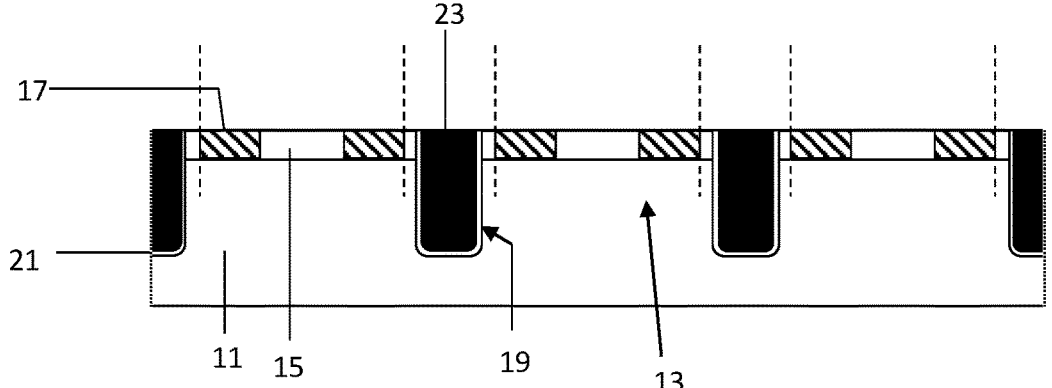
FIG. 7 illustrates, by means of a cross-sectional view, yet another step of an example of a method for manufacturing the electronic chip illustrated in FIG. 1.

FIG. 7 illustrates by means of a cross-sectional view of a step b1) of filling the openings 19 of the structure obtained on completion of the steps of FIGS. 2 to 6.

According to the embodiment illustrated in FIG. 7, the material of the layer 23 is deposited so as to fill the openings 19. The layer 23 is deposited, for example, by electroplating. The metallic material is thus molded into the openings 19.

According to one embodiment, the step illustrated in FIG. 7 is followed by a mechanical polishing or chemical mechanical polishing (CMP) step. The CMP step removes the portions of the layers 21 and 23 located on the front face of the structure. In other words, the CMP step exposes the upper face of layer 15 and the contact connection pads 17.

Figure 8:
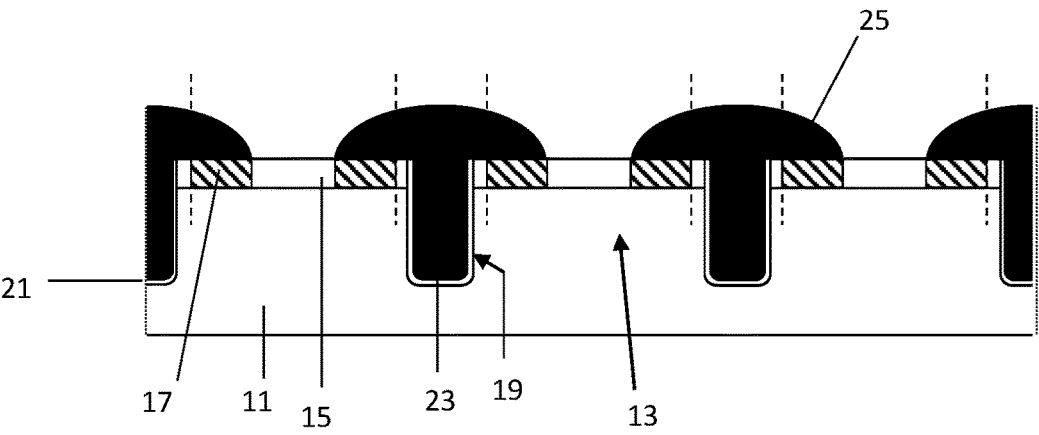
FIG. 8 illustrates, by means of a cross-sectional view, yet another step of an example of a method for manufacturing the electronic chip illustrated in FIG. 1.

FIG. 8 illustrates by means of a cross-sectional view of a step c1) of forming bumps 25 of a metallic material on the upper face of the structure obtained from the steps of FIGS. 2 to 7.

The bumps 25 are preferably made of the same material as the layer 23. However, the materials of layers 25 and 23 may be different.

Each bump 25 is, according to the embodiment illustrated in FIG. 8, made to cover a single opening 19 by extending to cover the adjacent contact connection pads 17. In other words, each bump 25 is made so that it electrically connects the material of the layer 23 located in the opening 19 that it covers and the contact connection pads 17 of two circuits 13 separated by this same opening 19. The contact connection pads 17 covered by the same bump 25 are the contact connection pads 17 located opposite this same opening 19. It should be noted that the bumps 25 are not, as will be seen later, intended to form functional interconnections between two adjacent chips.

According to one method of implementation, the bumps 25 are formed by screen printing or by electrolytic growth.

In another method of implementation, the bumps 25 are formed by metal deposition through a mask.

Figure 9:
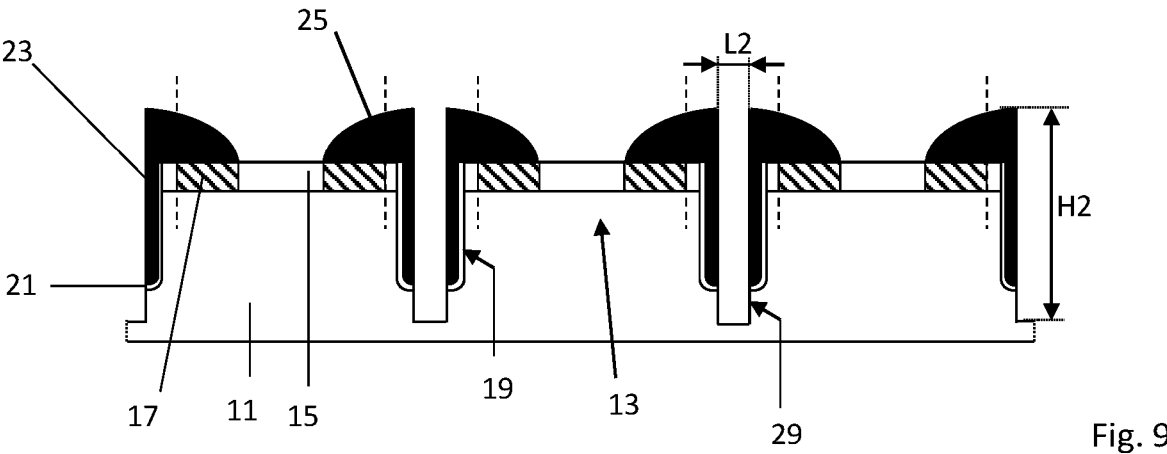
FIG. 9 illustrates, by means of a cross-sectional view, yet another step of an example of a method for manufacturing the electronic chip illustrated in FIG. 1.

FIG. 9 illustrates by means of a cross-sectional view of a step d1) of forming the trenches 29, in the bumps 25 and the layer 23, from the upper face of the structure obtained on completion of the steps of FIGS. 2 to 8.

The trenches 29 extend between the circuits 13 such that, in plan view, each circuit 13 is separated from its neighbor by a trench 29. By way of example, each circuit 13 is entirely delimited, laterally, by the trenches 29. The trenches 29 may, for example, when viewed from above, form a continuous grid extending between the integrated circuits 13 for the purpose of individualizing the chips. In this regard, trenches 29 are formed at least in line with the openings 19. The trenches 29 are, for example, made by sawing.

The sawing operation cuts the bumps 25 and the layer 23, so as to separate each bump 25 and each portion of the layer 23 into two portions, intended to form the metal contacts 31 illustrated in FIG. 1.

According to one embodiment, the trenches 29 extend vertically from the upper face of the structure obtained from the steps of FIGS. 2 to 8. In this example, the trenches 29 are non-through, i.e., they do not open on the lower face of the substrate 11.

The trenches 29 extend vertically to a depth H2, for example greater than the depth of the integrated circuits 13. The depth H2 is calculated so that the trenches 29 extend deeper into the substrate 11 than the bottom of the openings 19. The depth H2 is between, for example, 100 μm and 400 μm, preferably between 100 μm and 200 μm. The trenches 29 present a width L2 that is smaller than the width L1. The width L2 is, for example, between 5 μm and 80 μm, preferably between 15 μm and 25 μm.

Figure 10:
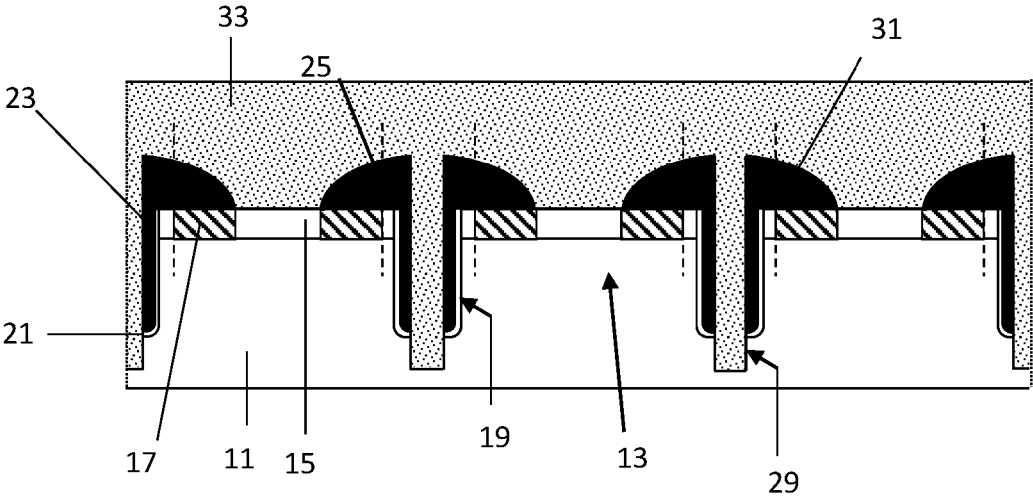
FIG. 10 illustrates, by means of a cross-sectional view, yet another step of an example of a method for manufacturing the electronic chip illustrated in FIG. 1.

FIG. 10 illustrates by means of a cross-sectional view a step e1) of depositing a protective resin 33 on the entire upper face of the structure obtained on completion of the steps of FIGS. 2 to 9.

More particularly, the upper face of the structure obtained on completion of the steps in FIGS. 2 to 9 is completely covered, and in particular the remaining bumps 25 are covered and the trenches 29 are filled with the protective resin 33. The resin 33 is, for example, an epoxy resin.

Figure 11:
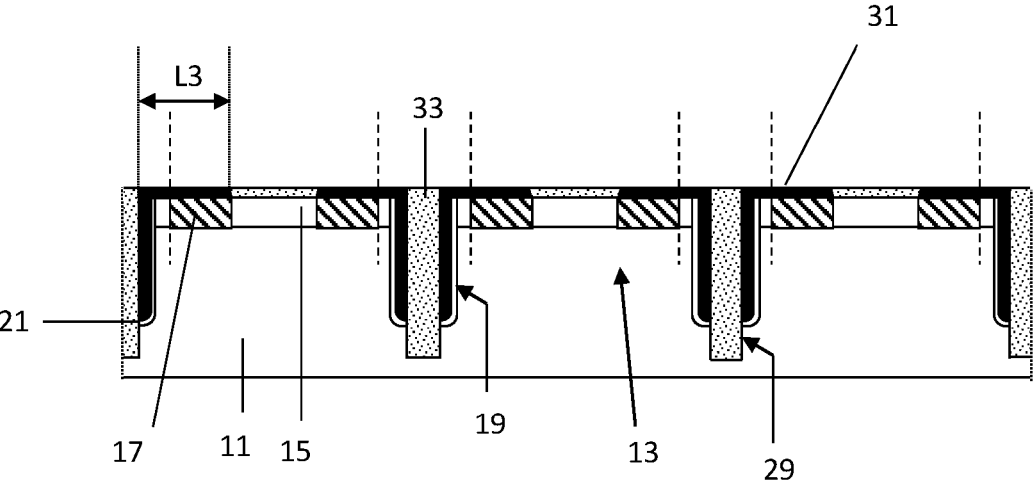
FIG. 11 illustrates, by means of a cross-sectional view, yet another step of an example of a method for manufacturing the electronic chip illustrated in FIG. 1.

FIG. 11 illustrates, by means of a cross-sectional view, a step f1) of planarizing the upper face of the structure obtained on completion of the steps of FIGS. 2 to 10. The planarization is, for example, performed by CMP. During this step, an upper portion of the protective resin 33 is removed. The planarization step continues until what remains of the bumps 25 is thinned to form the metal contacts 31. Thus, the metal contacts 31 are flush with the surface of the upper face of what remains of the resin layer 33 between these contacts.

More particularly, planarization continues until the metal contacts 31 are uncovered over a length L3 (in the plane of the chip) greater than 20 μm and a width greater than 100 m. The length L3 is, for example, between 20 μm and 600 μm, preferably between 100 m and 300 μm. The width of the metal contacts 31 is, for example after the planarization step, between 100 μm and 600 μm, preferably between 100 μm and 400 μm. These dimensions are selected based on the width of the trenches 29 and the dimensions of the contact connection pads 17.

Figure 12:
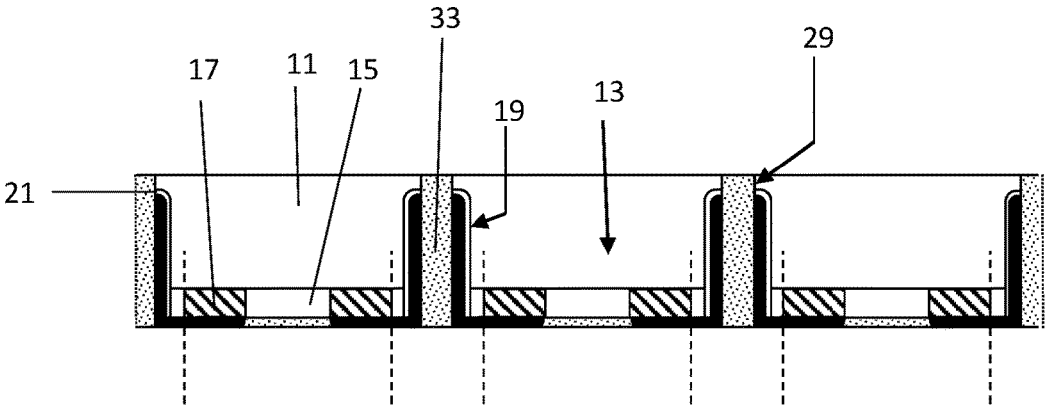
FIG. 12 illustrates, by means of a cross-sectional view, yet another step of an example of a method for manufacturing the electronic chip illustrated in FIG. 1.

FIG. 12 illustrates by means of a cross-sectional view a step g1) of planarizing the lower face of the structure obtained at the end of the steps of FIGS. 2 to 11.

It should be noted that in the example of FIG. 12, the orientation of the structure is reversed with respect to the cross-sectional views of the previous figures.

The substrate 11 is thinned from its rear face (top face in FIG. 12), for example by CMP. In this example, the substrate 11 is thinned from its rear face until it reaches at least the bottom of the trenches 29, so that, after thinning, the resin 33 present in the trenches 29 is flush with the surface of the rear face of the substrate 11. On completion of this step, the integrated circuits 13 are no longer connected to each other by what remains of the layer 33 and, possibly, a support film, not represented in FIG. 12, is attached to the upper face of the structure.

Figure 13:
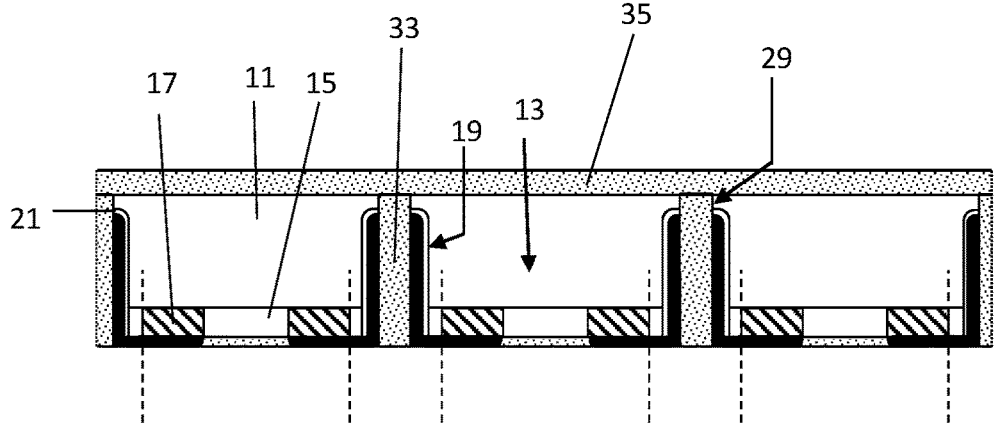
FIG. 13 illustrates, by means of a cross-sectional view, yet another step of an example of a method for manufacturing the electronic chip illustrated in FIG. 1.

FIG. 13 illustrates, by means of a cross-sectional view, a step of depositing a protective resin 35 on the rear face of the lower face of the structure obtained on completion of the steps of FIGS. 2 to 12.

The layer 35 extends, for example, covered completely, continuously, and in a substantially constant thickness over the entire surface of the rear face of the structure. The layer 35 presents, for example, a thickness between 10 μm and a thickness according to the final dimension of the housing. The thickness of the layer 35 is preferably between 10 μm and 100 μm, for example of the order of 25 μm. The resins in layers 35 and 33 may be of the same or different compositions.

Figure 14:
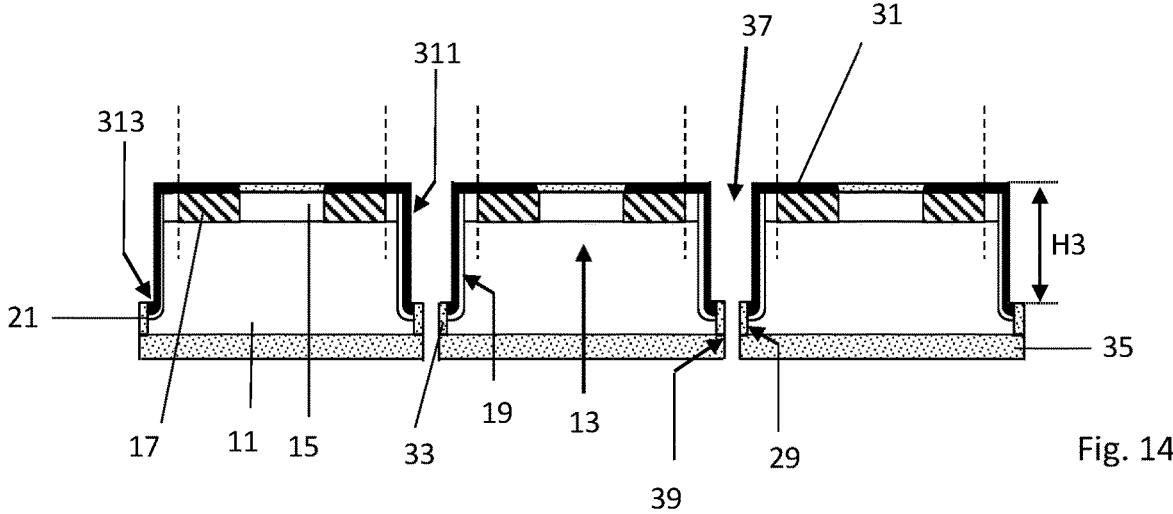
FIG. 14 illustrates, by means of a cross-sectional view, yet another step of an example of a method for manufacturing the electronic chip illustrated in FIG. 1.

FIG. 14 illustrates, by means of a cross-sectional view, a chip individualization step. This step comprises the formation (step h1)) of the openings 37, in line with (plumb with) the openings 19, and the formation (step i1)) of the trenches 39, in line with the trenches 29, from the front face of the structure obtained on completion of the steps of FIGS. 2 to 13.

Figure 15:
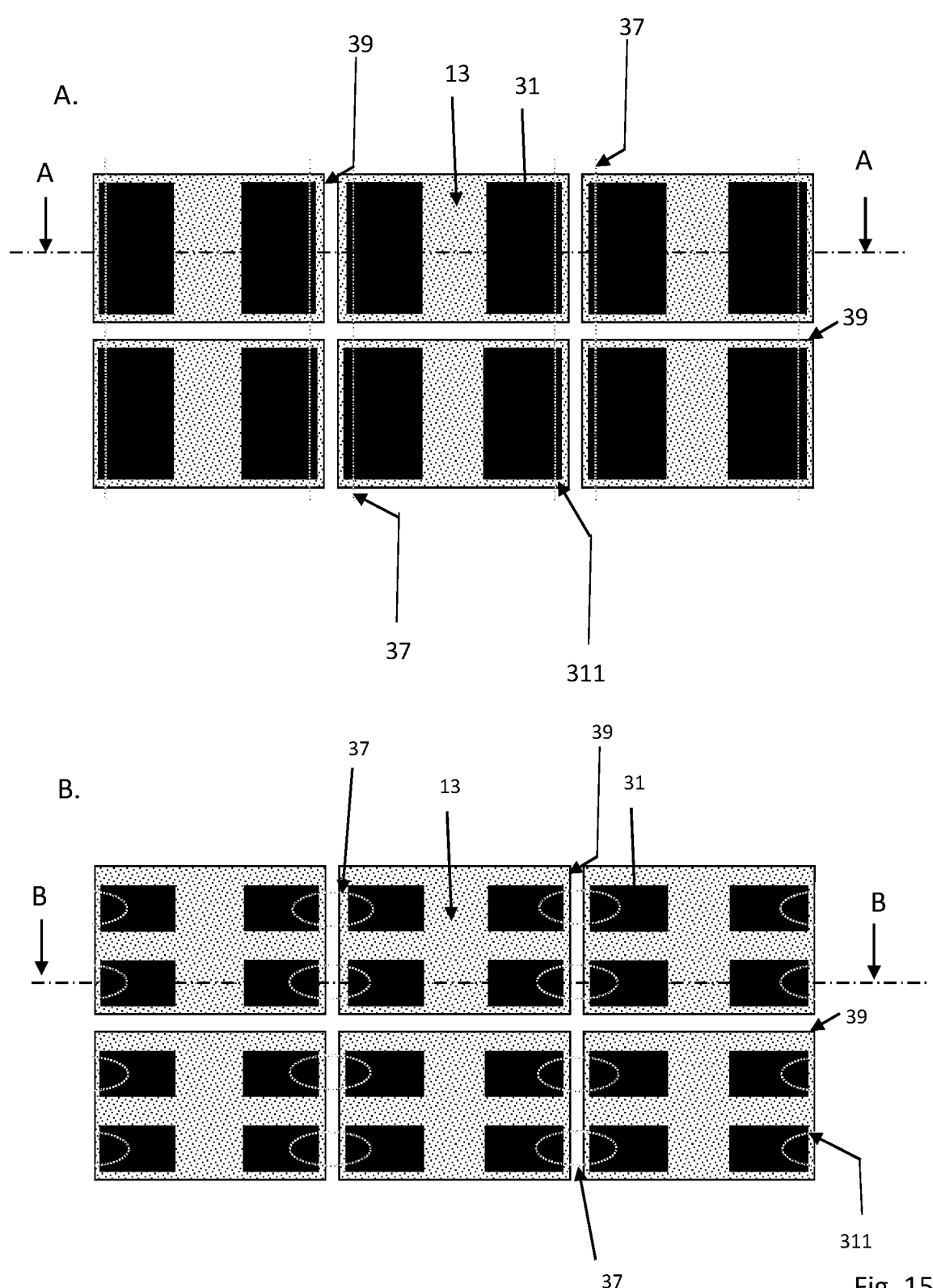
FIG. 15 illustrates by means of two top views of two embodiments of the structure illustrated in FIG. 14.

FIG. 15 illustrates, by means of two top views (A) and (B), two embodiments of the structure illustrated in FIG. 14, FIG. 14 corresponding then to a section according to the sectional plane A-A of view (A) of FIG. 15 or to a section according to the sectional plane B-B of view (B) of FIG. 15.

More particularly, FIG. 14 illustrates a step comprising the formation of openings 37 in line with the openings 19 to expose the flanks of the metal contacts 31 and forming the trenches 39 in line with the trenches 29 allowing to cut the structure into individual chips each comprising a single integrated circuit 13.

The openings 37 extend vertically, from the upper face of the structure, to a depth H3. The depth H3 is calculated so that the openings 37 do not extend to the bottom of the openings 19. The depth H3 is therefore less than the depth H1 (FIG. 3). The depth H3 corresponds, on completion of the step illustrated in FIGS. 14 and 15, to the height of the metallization on the flank of the chip. The depth H3 is, for example, of the order of 100 μm.

The openings 37 are created in the filling previously made in the openings 19 and have the same shape as the openings 19 except for the dimensions.

If the apertures 19 correspond to non-through trenches extending along and in the length of the substrate 11 as illustrated in view (A) of FIG. 4, the openings 37 correspond to non-through trenches extending along and in the length of the substrate 11. Alternatively, if the openings 19 correspond to openings located in the substrate 11 as illustrated in view (B) of FIG. 4, the openings 37 correspond to openings located in line with the openings 19.

The openings 37 present a width greater than or equal to the width of the openings 19. More particularly, in this example, the width of each opening 37 is selected to be sufficiently large to allow a sidewall 311 of at least one metal contact 31 of each of the integrated circuits 13 located on either side of the aperture 37 or a portion of the aperture 37 to be exposed.

By way of example, after the openings 37 are formed, at least one flank 311 of at least one metal contact 31 of each circuit 13 is exposed.

To form the openings 37, a partial removal of the resin 33 located in the trenches 29 is performed. The partial removal of the resin 33 is optionally accompanied by removal of a portion of the metal contacts 31 located, in plan view, on either side of the trenches 29. In the example represented, a portion of the metal contacts 31 located on either side of the trenches 29 is removed, resulting in the formation of the steps 313 on the metal contacts 31.

According to the embodiment illustrated in view (A) of FIG. 15, the openings 37 can be made by sawing, using a cutting blade of greater width than that used to make the trenches 29 and less than that used to make the openings 19. Alternatively, the openings 37 may be made by any other cutting means, for example, by laser cutting.

The trenches 39 are made in the resin 33, in line with the trenches 29. More specifically, in this example, a trench 39, parallel to the trench 29, extends all the length of trench 29 in line with each trench 29. The trenches 39 extend, vertically, over the entire thickness of the structure. The width of the trenches 39 is less than that of the trenches 29 so that, after formation of the trenches 39, each integrated circuit 13, and consequently each chip 1, remains covered by the resin 33 or 35 on all its faces except for the metal contacts 31 forming the wettable flanks of the chip. As an example, on completion of the step illustrated in FIG. 15, the upper face of the chip is flat, with the metal contacts 31 flush with the upper face of what remains of the protective resin 33.

On completion of this step, the structure obtained corresponds to a plurality of electronic chips. The flanks 311 of the metal contacts 31 exposed in the step of FIGS. 14 and 15 (formation of openings 37) correspond to the wettable flanks of the chips.

The step illustrated in FIGS. 14 and 15 is preceded by a step of transferring the structure obtained on completion of the steps of FIGS. 2 to 12, preferably by its rear face, onto a support film allowing the chips to be held together. The chips can then be picked up from the support film.

Figures 16, 17:
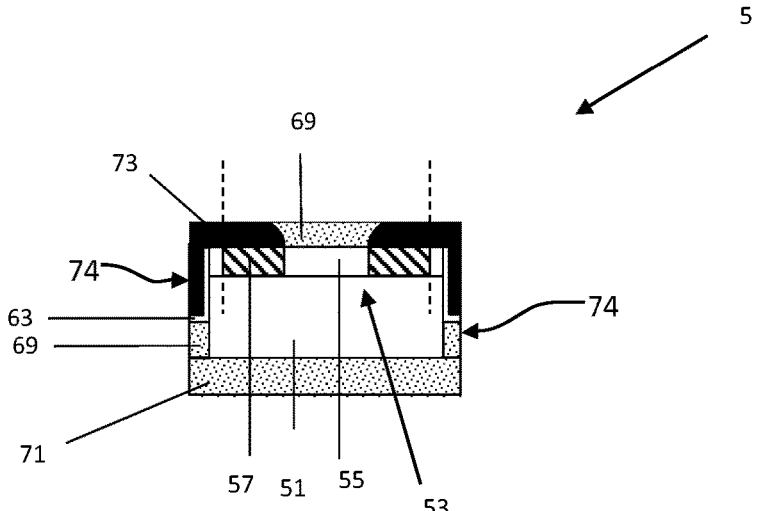
FIG. 16 illustrates, by means of a cross-sectional view, a second embodiment of an electronic chip.
FIG. 17 illustrates, by means of a cross-sectional view, a step of an example of a method for manufacturing the electronic chip illustrated in FIG. 16.

FIG. 16 illustrates, by means of a partial schematic cross-sectional view, a second embodiment of an electronic chip 5.

The electronic chip 5 comprises a semiconductor substrate 51 in and on which an integrated circuit 53 is formed. The substrate 51 is made of a semiconductor material such as silicon. The substrate 51 and the integrated circuit 53 are topped by a stack of insulating and conductive layers 55 referred to as an interconnect stack, in which interconnect elements of the components of the circuit 53 may be formed. The interconnect stack 55 further comprises, one or more contact connection pads 57 which may be metallic, for example two pads 57 as illustrated in FIG. 16. The contact connection pads 57 are flush with the surface of the structure formed by the substrate 51, the integrated circuit(s) 53 and the stack 55 and are intended to be connected to an external device.

The structure formed by the substrate 51, the stack 55 and the contact connection pads 57 presents a shape that is preferably parallelepipedic, for example a cubic shape or the shape of a block with six flat sides.

The chip 5 illustrated in FIG. 16 further comprises metal contacts 73. Each metal contact 73 is formed on and in contact with a contact connection pad 57 and extends along a portion of the side flanks of the substrate 51. The metal contacts 73 thus extend along the substrate 51 within the thickness of the substrate 51. Each metal contact 73 is flush with a top face of the chip 5.

According to the embodiment illustrated in FIG. 16, all contact connection pads 57 are covered by a metal contact 73.

As an example, the metal contacts 73 are separated from the substrate 51 by an insulation layer 63.

The portions of the structure, formed by the substrate 51, the stack 55, and the contact connection pads 57, that are not covered by a metal contact 73 are covered by an insulating protective resin or resins. For example, a portion of the top face and a portion of the side edges of the structure are covered by a resin layer 69 and the bottom face of the structure is covered by a resin layer 71.

As shown in FIG. 16, the electronic chip 5 includes respective sidewalls 74. At these respective sidewalls 74, respective surfaces, sidewall surfaces, or sidewalls of the metal contacts 73, the insulation layer 63, the resin layer 69, and the resin layer 71 are substantially coplanar and flush with each other.

FIGS. 17-29 are cross-sectional and top views illustrating successive steps of an example of a method for manufacturing microchips according to a second embodiment.

FIG. 17 is a cross-sectional view of a starting structure comprising the semiconductor substrate 51 in and on which the integrated circuits 53 have been previously formed. The circuits 53 are, for example, all identical within manufacturing dispersions. The substrate 51 may correspond to a wafer of a semiconductor material, for example silicon. The substrate 51 presents, for example, a thickness between 300 μm and 900 μm, for example a thickness of about 500 μm.

The structure of FIG. 17 further comprises the stack of insulating and conductive layers 55 coating the top face of the substrate 51. The interconnect stack 55 further comprises, for each integrated circuit 53, one or more contact connection pads 57. In the example in FIG. 17, two contact connection pads 57 are represented for each circuit 53. However, the number of contact connection pads 57 per circuit 53 may be different than two.

Each integrated circuit 53 comprises, for example, one or more electronic components (transistors, diodes, thyristors, triacs, etc.).

In FIG. 17, three integrated circuits 53 have been represented, with the understanding that the number of integrated circuits 53 formed in and on the substrate 51 may be different than three. In practice, the substrate 51 is a wafer made of a semiconductor material, for example, silicon, and several tens or even several hundred integrated circuits 53 are formed in and on the substrate 51. The integrated circuits 53 are then organized in an array in rows and columns in a regular grid pattern.

In the remainder of this description, in the orientation of FIG. 17, the lower face of the structure is considered to be the rear face and the upper face of the structure is considered to be the front face.

Figure 18:
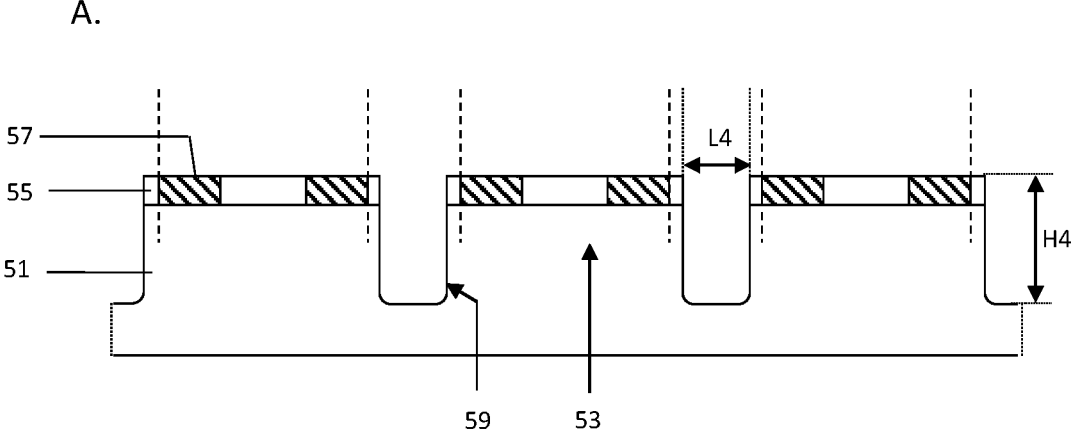
FIG. 18 illustrates, by means of a cross-sectional view and a top view, another step of an example of a method for manufacturing the electronic chip illustrated in FIG. 16.
Figure 18:
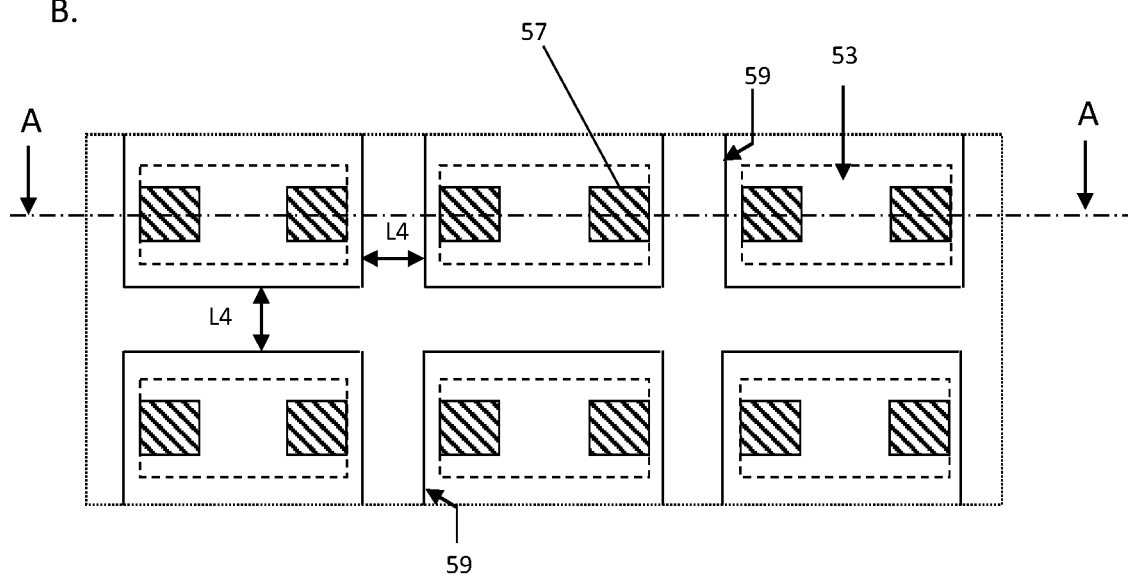

FIG. 18 illustrates, by a cross-sectional view (A) and a top view (B), a step a2) of forming openings 59, in the front face of the starting structure illustrated in FIG. 17.

View (A) is a cross-sectional view along cross-sectional plane A-A of view (B).

The openings 59 extend between the circuits 53 such that, in plan view, each circuit 53 is separated from its neighbor by an opening 59. By way of example, each circuit 53 is entirely delimited, laterally, by the openings 59. The openings 59 may, for example, in the top view, form a continuous grid extending between the integrated circuits 53.

In the example represented, the openings 59 extend vertically from the front side of the stack 55 and extend into the substrate 51. In this example, the openings 59 are non-through, i.e., they do not open on the rear face of the substrate 51. The openings 59 extend vertically to a depth H4, for example between 50 μm and 200 μm, preferably of the order of 120 μm. The openings 59 present, for example, a width L4 of between 20 μm and 100 m, preferably between 40 μm and 70 μm, with the width L4 preferably being equal to about 55 μm, for example equal to 55 μm.

The openings 59 are, for example, formed by sawing, etching or laser ablation. In the step of forming the openings 59, the structure may be mounted on a carrier film, not represented, arranged on the rear face of the substrate 51, the film being removed after the apertures 59 are formed.

Figure 19:
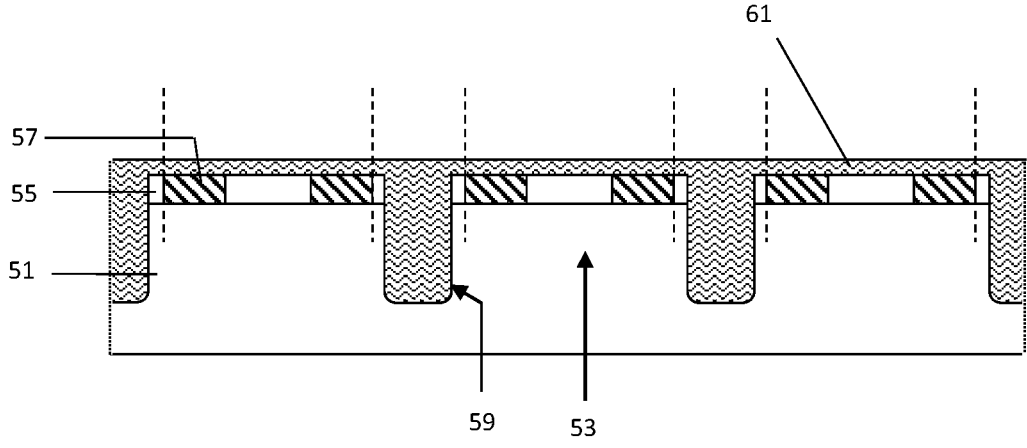
FIG. 19 illustrates, by means of a cross-sectional view, yet another step of an example of a method for manufacturing the electronic chip illustrated in FIG. 16.

FIG. 19 illustrates, by means of a cross-sectional view, a step b2) of depositing a resin 61 on the entire upper surface of the structure obtained on completion of the steps of FIGS. 16 to 18.

More particularly, during this step, the front face of the structure obtained on completion of the steps of FIGS. 16 to 18 is completely covered, and in particular the openings 59 are filled with the resin layer 61. The resin of the layer 61 is, for example, a photosensitive resin, preferably negative. The layer resin 61 is, for example, SU-8 resin.

Figure 20:
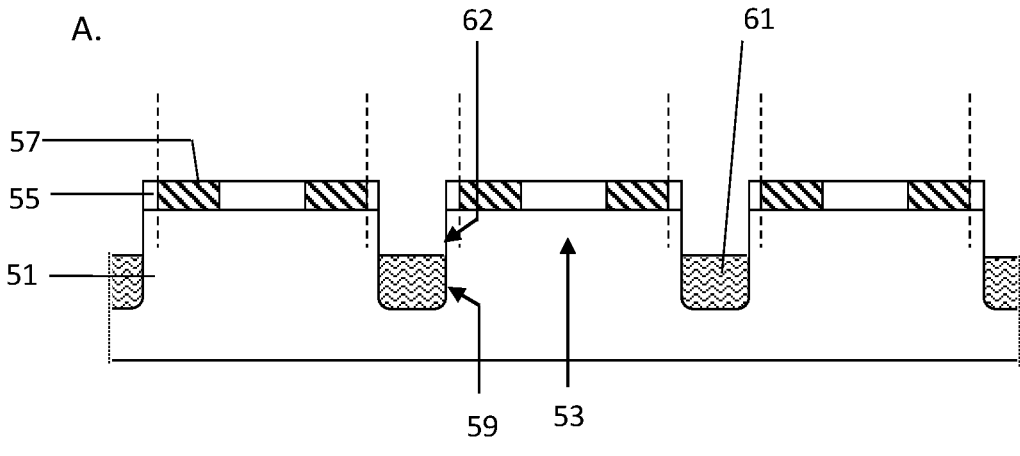
FIG. 20 illustrates, by means of two cross-sectional views and a top view, yet another step of an example of a method for manufacturing the electronic chip illustrated in FIG. 16.
Figure 20:
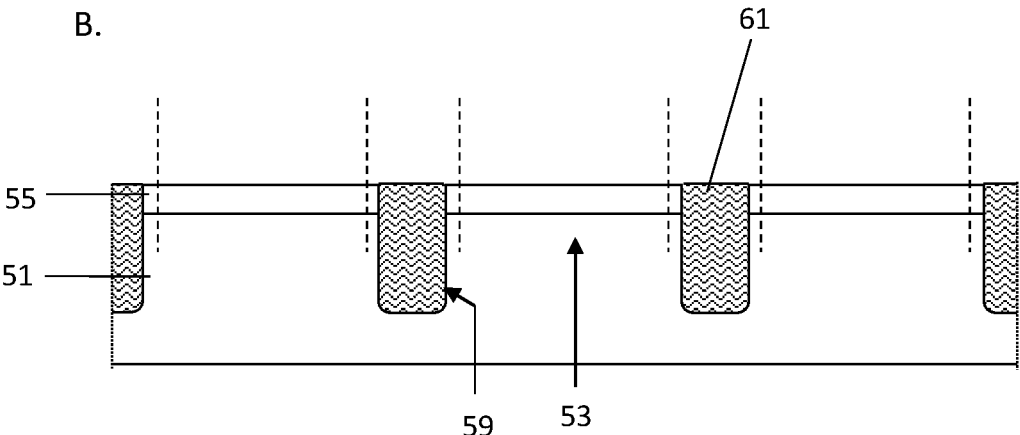
Figure 20:
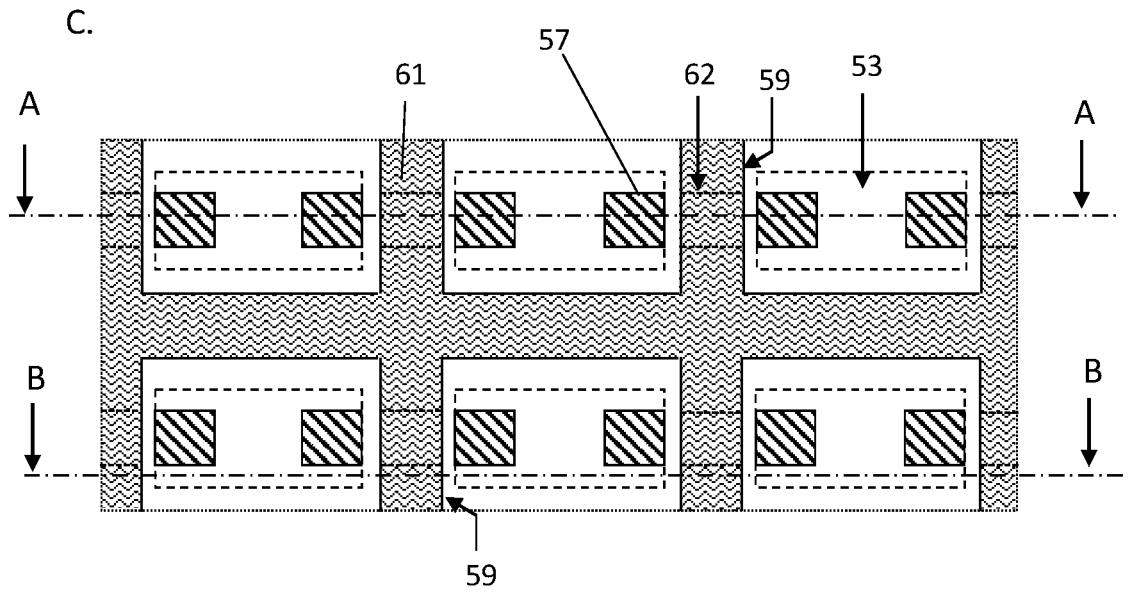

FIG. 20 illustrates, by means of two cross-sectional views (A) and (B) and a top view (C), a step c2) of partially removing the layer resin 61 from the front face of the structure obtained from the steps of FIGS. 16 to 19.

View (A) is a cross-sectional view according to sectional plane A-A of view (C) and view (B) is a cross-sectional view according to sectional plane B-B of view (C).

More particularly, in this step, openings 62 are made in the filled openings 59 of the layer 61 between the circuits 13 such that there is at least one opening 62 opposite each contact connection pad 57. By way of example, an opening 62 may be located opposite multiple contact connection pads 57 of the same circuit 53 or of two adjacent circuits 53.

The openings 62 extend vertically into the layer 61 to a depth, for example, of less than the depth of the openings 59. Indeed, the depth of the openings 62 is calculated so that the openings 62 do not extend deeper than the bottom of the openings 59. The depth of the openings 62 corresponds substantially to the height of the metallized contacts 73 of the chip on completion of the manufacturing method. By way of example, the openings 62 are formed so that the thickness of what remains of the layer 61 at the bottom of the openings 59, after the step illustrated in FIG. 20, is approximately greater than 10 μm, preferably equal to 20 μm.

The openings 62 are, for example, made by a photolithography method or by laser ablation.

The step of forming the openings 62 is followed, for example, by a mechanical or chemical mechanical polishing (CMP) step. The CMP step removes the portions of the layer 61 located on the front face of the structure. In other words, the CMP step uncovers the top face of the layer 15 and the contact connection pads 17. By way of example, the CMP step and the opening forming step 62 can be reversed so that the openings forming step 62 follows the CMP step.

Figure 21:
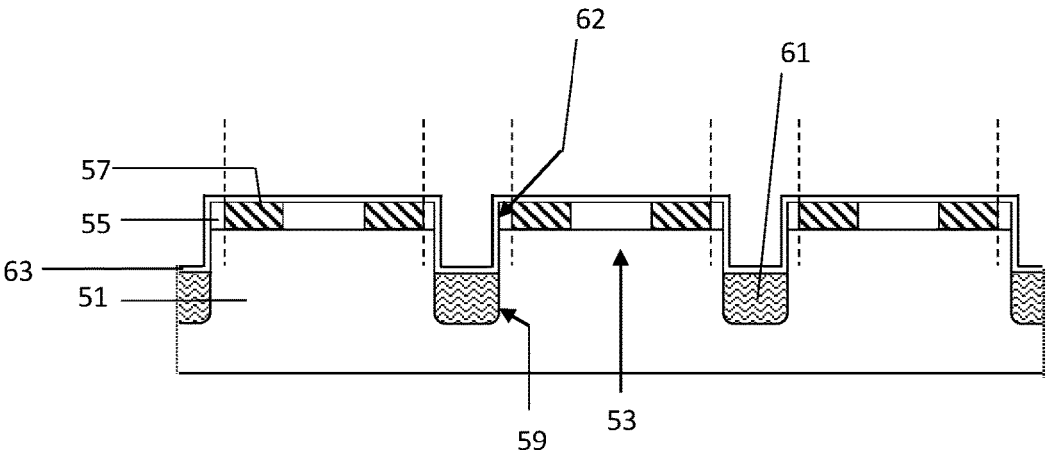
FIG. 21 illustrates, by means of a cross-sectional view, yet another step of an example of a method for manufacturing the electronic chip illustrated in FIG. 16.

FIG. 21 illustrates, by means of a cross-sectional view, a conformal deposition step of an insulation layer 63, on the front face of the structure obtained on completion of the steps of FIGS. 16 to 20.

According to the embodiment illustrated in FIG. 21, the layer 63 is formed as a complete covering, i.e., the layer 63 covers the upper face of the structure obtained from the steps of FIGS. 16 to 20 as well as a portion of the side edges and the bottom of the openings 62. The layer 63 presents, for example, a thickness between 1 μm and 6 μm.

According to one embodiment, the layer 63 is a silicon dioxide ($SiO_2$) layer.

According to one embodiment, the layer 63 is formed by growth via dry or wet oxidation.

According to another embodiment, a portion of the layer 63, located at the side edges of the openings 62, is porous silicon formed in the openings 62 or is an insulator formed by deep reactive ion etching (DRIE).

Figure 22:
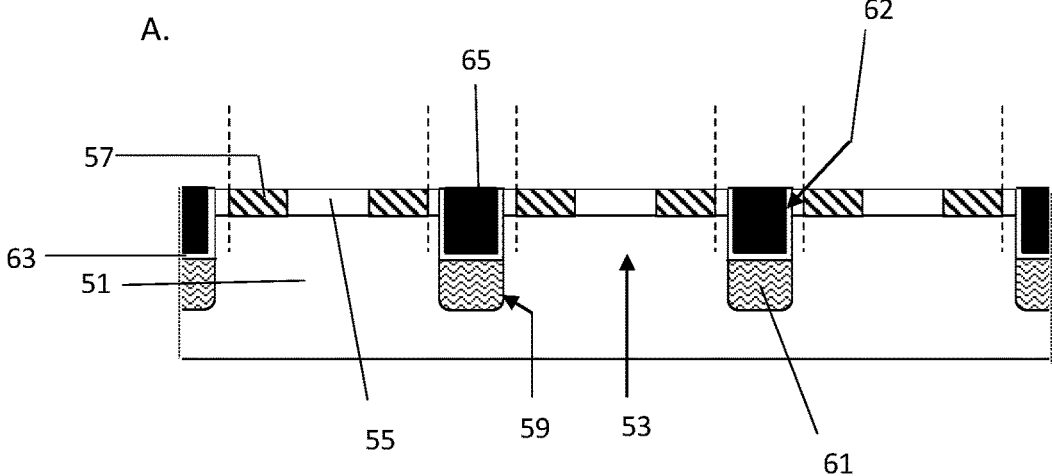
FIG. 22 illustrates, by means of a cross-sectional view and a top view, yet another step of an example of a method for manufacturing the electronic chip illustrated in FIG. 16.
Figure 22:
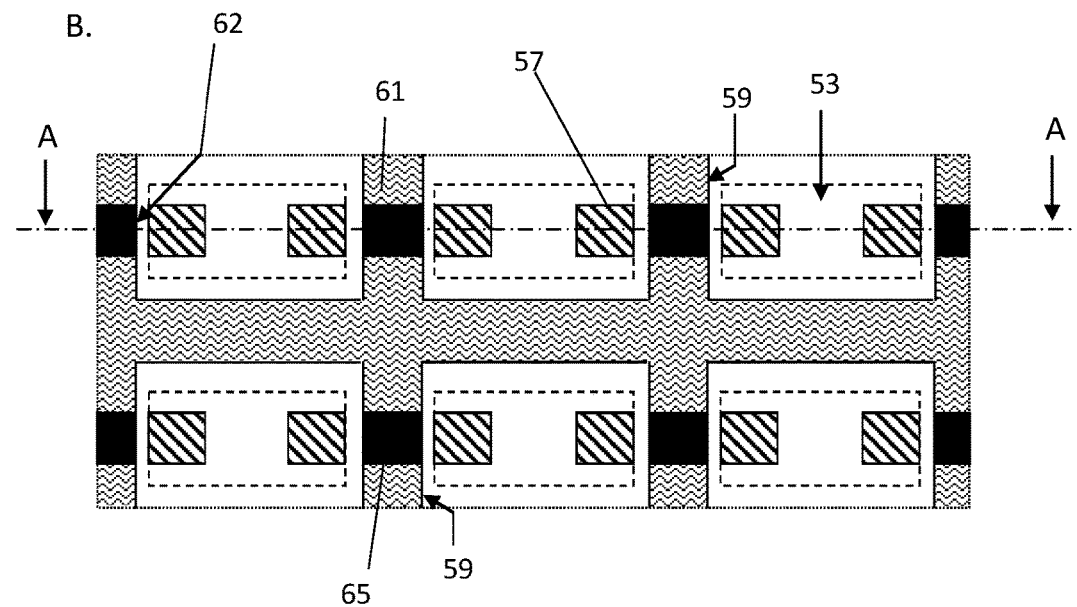

FIG. 22 illustrates, by means of a cross-sectional view (A) and a top view (B), a step d2) of depositing a layer 65 of a metallic material on top of what remains of the layer 61 in the openings 62, of the structure obtained on completion of the steps of FIGS. 16 to 21. View (A) is a cross-sectional view according to the cross-sectional plane A-A of view (B).

According to the embodiment illustrated in FIG. 22, the material of the layer 65 is deposited so as to fill the openings 62. The layer 65 is deposited, for example, by electroplating. The metallic material of the layer 65 is thus molded into the openings 62.

According to one embodiment, the step illustrated in FIG. 22 is followed by a mechanical polishing or chemical-mechanical polishing step. The CMP step removes portions of the layers 65 and 63 located on the front face of the structure. In other words, the CMP step exposes the front face of the layer 15 and the contact connection pads 17.

The layer 65 is, for example, made of an alloy of copper and/or tin and/or silver or any other material suitable for brazing. As an example, layer 65 is made of a tin-silver alloy (SnAg).

Figure 23:
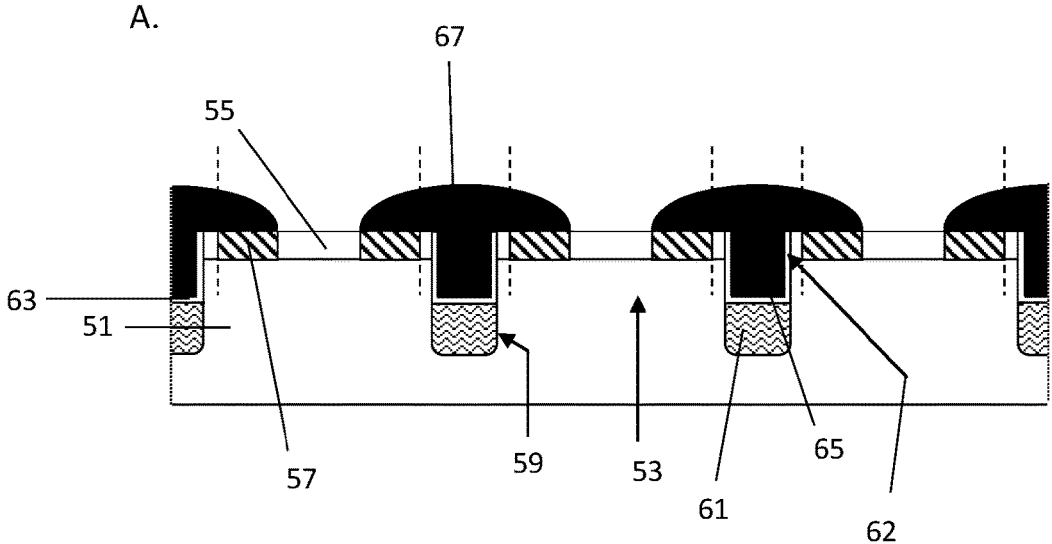
FIG. 23 illustrates, by means of a cross-sectional view and a top view, yet another step of an example of a method for manufacturing the electronic chip illustrated in FIG. 16.
Figure 23:
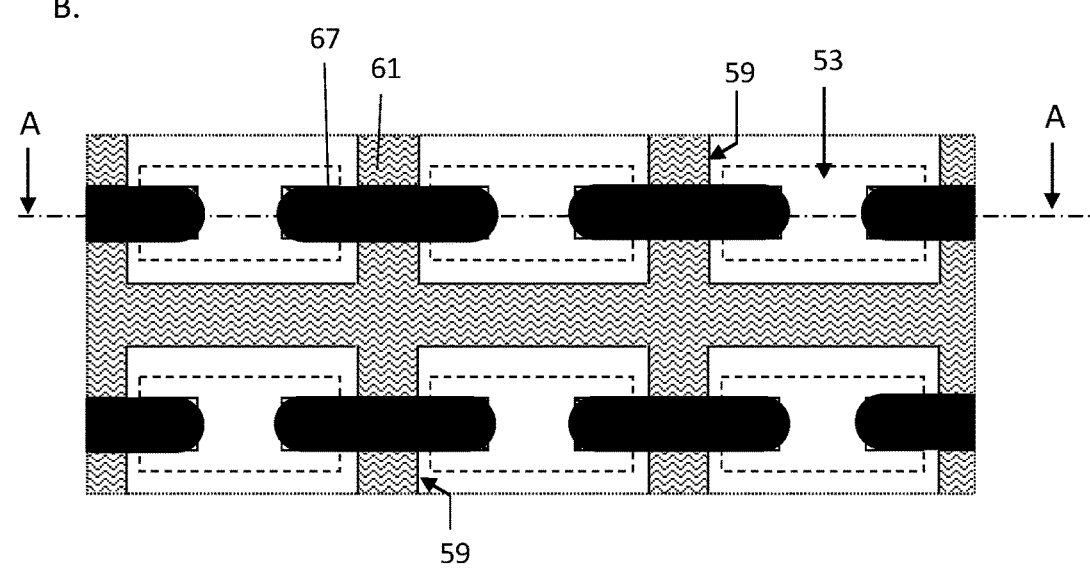

FIG. 23 illustrates, by means of a cross-sectional view (A) and a top view (B), a step e2) of forming bumps 67 of a metallic material on the upper face of the structure obtained on completion of the steps of FIGS. 16 to 22. View (A) is a cross-sectional view along the cross-sectional plane A-A of view (B).

The bumps 67 are preferably made of the same material as the layer 65. However, the materials of the layers 67 and 65 may be different.

Each bump 67 is, according to the embodiment illustrated in FIG. 23, made to cover a single opening 62 by extending so as to cover the adjacent contact connection pads 57. In other words, each bump 67 is made so that it electrically connects the material of the layer 65 located in the opening 62 that it covers and the contact connection pads 57 of the two circuits 53 separated by this same opening 62. The contact connection pads 57 covered by the same bump 67 are the contact connection pads 57 located opposite this same opening 62. It should be noted that the bumps 67 are not, as will be seen later, intended to form functional interconnections between two adjacent chips.

According to one method of implementation, the bumps 67 are formed by screen printing or by electrolytic growth.

In another method of implementation, the bumps 67 are formed by metal deposition through a mask.

As an example, the bumps 67 are, as represented in view (B), all oriented in the same direction.

Figure 24:
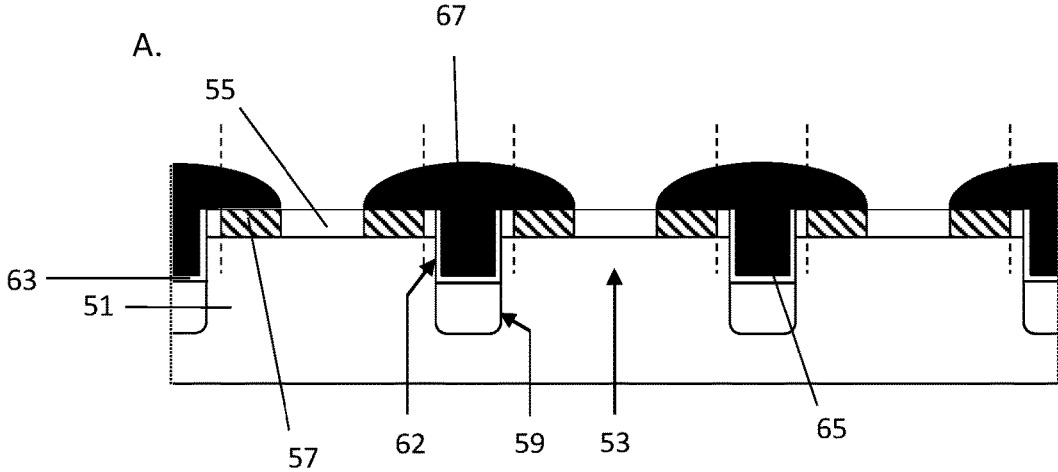
FIG. 24 illustrates, by means of two cross-sectional views and a top view, yet another step of an example of a method for manufacturing the electronic chip illustrated in FIG. 16.
Figure 24:
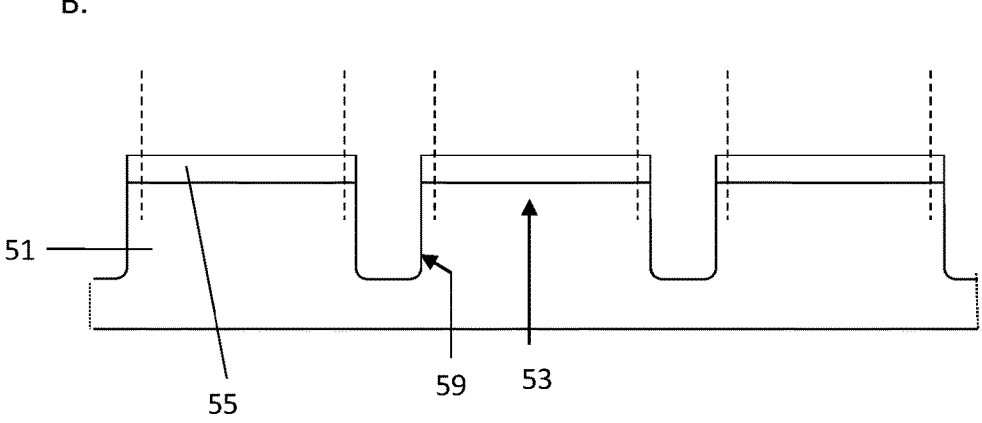
Figure 24:
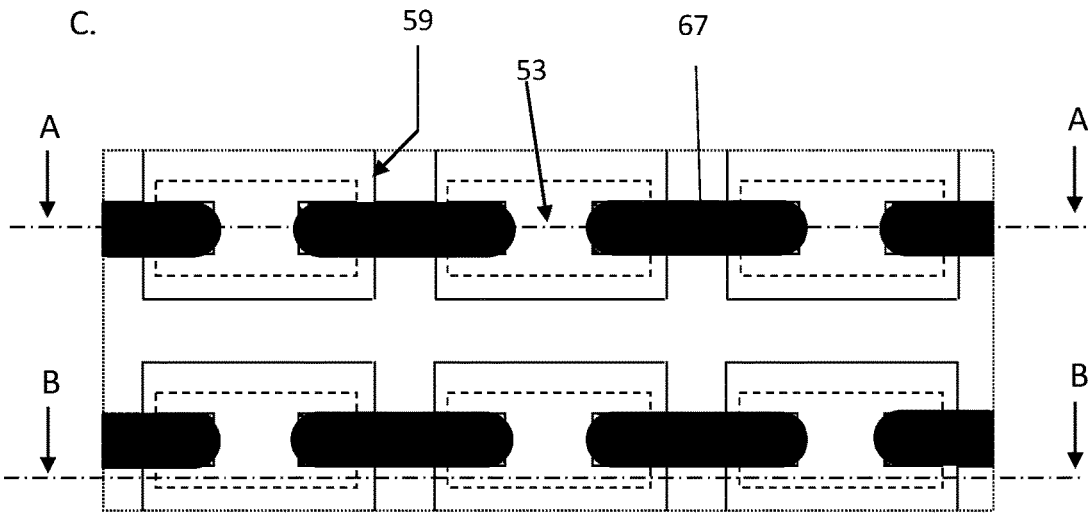

FIG. 24 illustrates, by means of two cross-sectional views (A) and (B) and a top view (C), a step f2) of removing what remains of the resin 61 from the structure obtained on completion of the steps of FIGS. 16 to 23.

View (A) is a cross-sectional view according to the sectional plane A-A of view (C) and view (B) is a cross-sectional view according to the sectional plane B-B of view (C).

More particularly, in this step, what resin remains of the layer 61 in the structure obtained after the step in FIG. 23 is removed, i.e., the layer 61 is removed in the openings 59 and in the openings 59 under the bumps 67.

This removal step is, for example, performed by etching with a solvent that solubilizes the resin of the layer 61.

On completion of this step, the bottom of the openings 59 located under the bumps 67 is accessible through the portions of the openings 59 not covered by the bumps. Note that the bumps 67 form, on completion of the step illustrated in FIG. 24, a sort of "bridge" above the openings 59.

Figure 25:
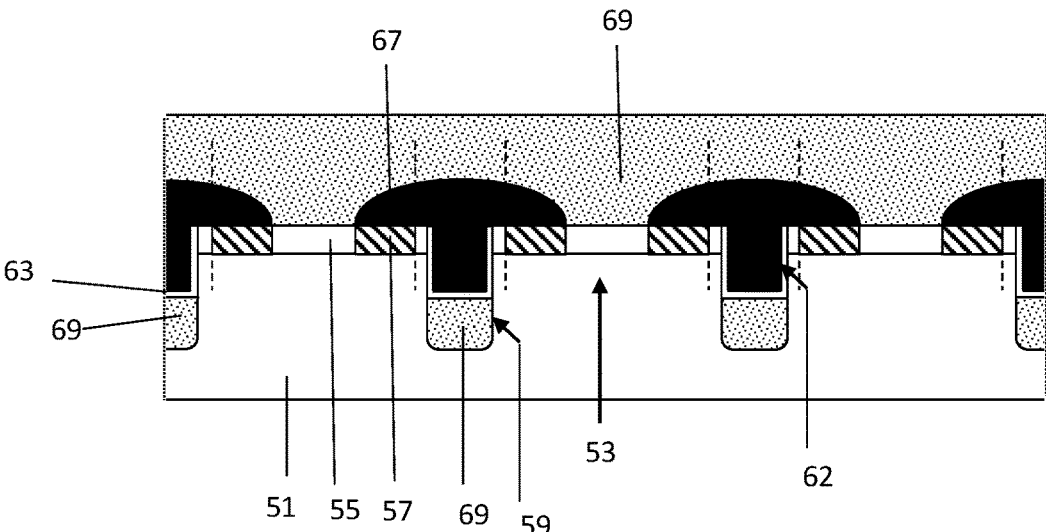
FIG. 25 illustrates, by means of a cross-sectional view, yet another step of an example of a method for manufacturing the electronic chip illustrated in FIG. 16.

FIG. 25 illustrates, by means of a cross-sectional view, a step of depositing a protective insulating resin 69 different from the resin 61 of FIG. 23, on the surface of the structure obtained on completion of the steps of FIGS. 16 to 24.

The resin 61 now completely removed was intended to define the openings 62 for forming the metallizations 65 while the resin 69 is intended to remain after the product is finished to electrically insulate the substrate 51.

In the step illustrated in FIG. 25, the upper face of the structure obtained from the steps of FIGS. 16 to 24 is completely covered, and in particular the bumps 67 are covered and the openings 59 under the bumps 67 and around the substrate 51 of each integrated circuit 53 are filled. The resin 69 is, for example, an epoxy resin.

Figure 26:
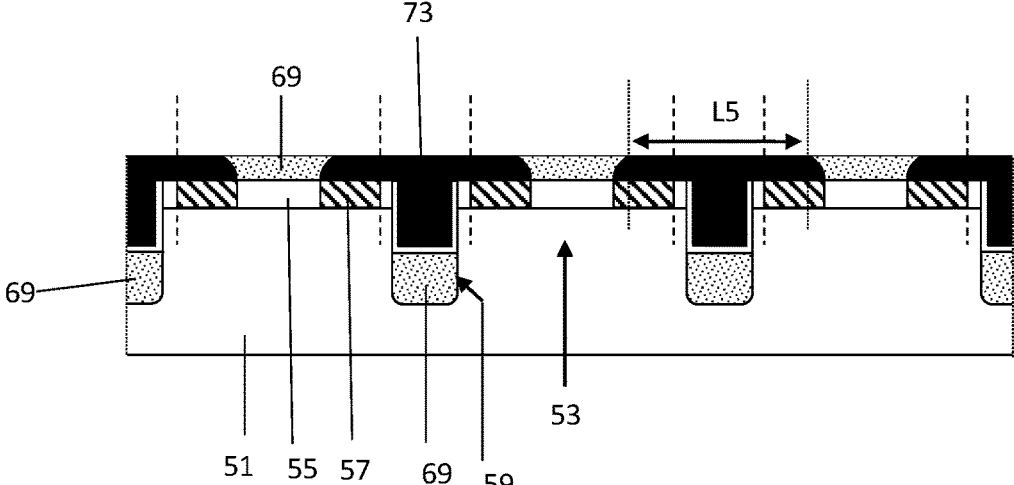
FIG. 26 illustrates, by means of a cross-sectional view, yet another step of an example of a method for manufacturing the electronic chip illustrated in FIG. 16.

FIG. 26 illustrates, by means of a cross-sectional view, a step g2) of planarizing the upper face of the structure obtained on completion of the steps of FIGS. 16 to 25. The planarization is, for example, performed by CMP. During this step, an upper portion of the protective resin 69 is removed. The planarization step continues until the remaining bumps 67 are thinned to form the metal contacts 73. Thus, the metal contacts 73 are flush with the surface of the upper face of what remains of the resin layer 69 between those contacts.

More particularly, planarization is performed until the metal contacts 73 are uncovered over a length L5 (in the plane of the chip) greater than 40 μm and a width greater than 100 μm. The length L5 is, for example, between 40 μm and 1400 μm, preferably between 200 μm and 1000 μm. The width of the metal contacts 73 is, for example after the planarization step, between 100 μm and 600 μm, preferably between 100 m and 400 μm. These dimensions are selected based on the width of the openings 59 and the dimensions of the contact connection pads 57.

Figure 27:
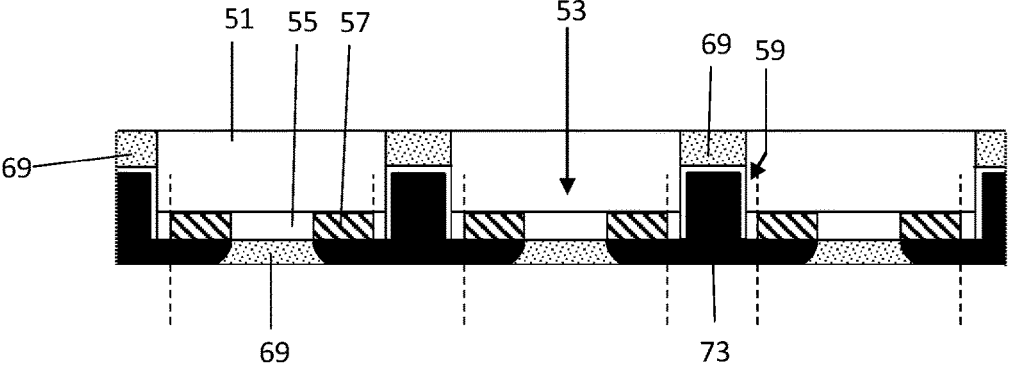
FIG. 27 illustrates, by means of a cross-sectional view, yet another step of an example of a method for manufacturing the electronic chip illustrated in FIG. 16.

FIG. 27 illustrates, by means of a cross-sectional view, a step h2) of planarizing the lower face of the structure obtained at the end of the steps of FIGS. 16 to 26.

It should be noted that in the example of FIG. 27, the orientation of the structure is reversed with respect to the cross-sectional views of the previous figures.

The substrate 51 is thinned from its rear face (top side in FIG. 27), for example by CMP. In this example, the substrate 51 is thinned from its rear face until it reaches at least the bottom of the openings 59, so that, after thinning, what remains of the resin 69 present in the openings 59 is flush with the surface of the rear face of the substrate 51. On completion of this step, the integrated circuits 53 are no longer connected to each other by what remains of the layer 69 and, possibly, a support film, not represented in FIG. 27, is attached to the upper face of the structure.

Figure 28:
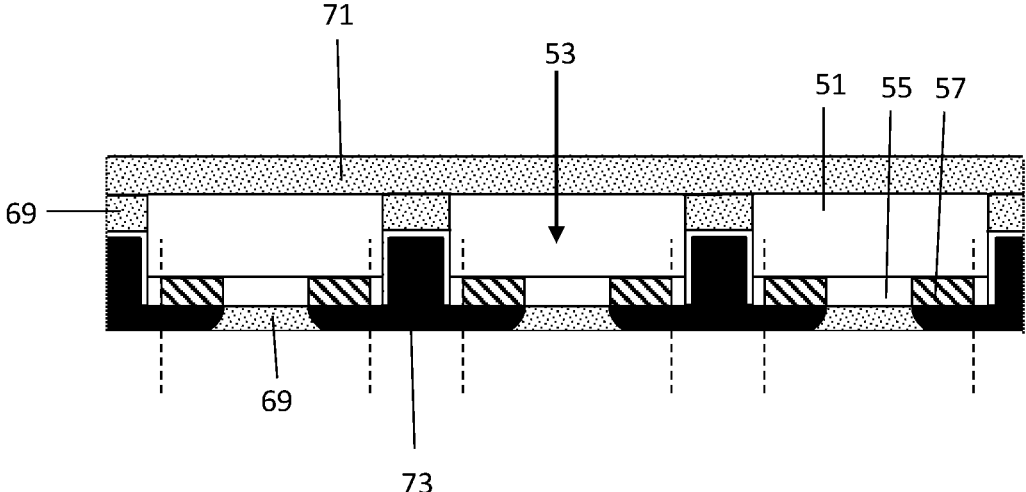
FIG. 28 illustrates, by means of a cross-sectional view, yet another step of an example of a method for manufacturing the microchip illustrated in FIG. 16.

FIG. 28 illustrates, by means of a cross-sectional view, a step of depositing a protective resin 71 on the rear face of the lower face of the structure obtained at the end of the steps of FIGS. 16 to 27.

The layer 71 extends, for example, covering completely, continuously, and to a substantially constant thickness over the entire surface of the rear face of the structure. The layer 71 presents, for example, a thickness between 10 μm and a thickness depending on the final dimension of the housing. Preferably, the thickness of layer 71 is between 10 μm and 100 μm, for example of the order of 25 μm. The resins in layers 71 and 69 may be of the same or different compositions.

Figure 29:
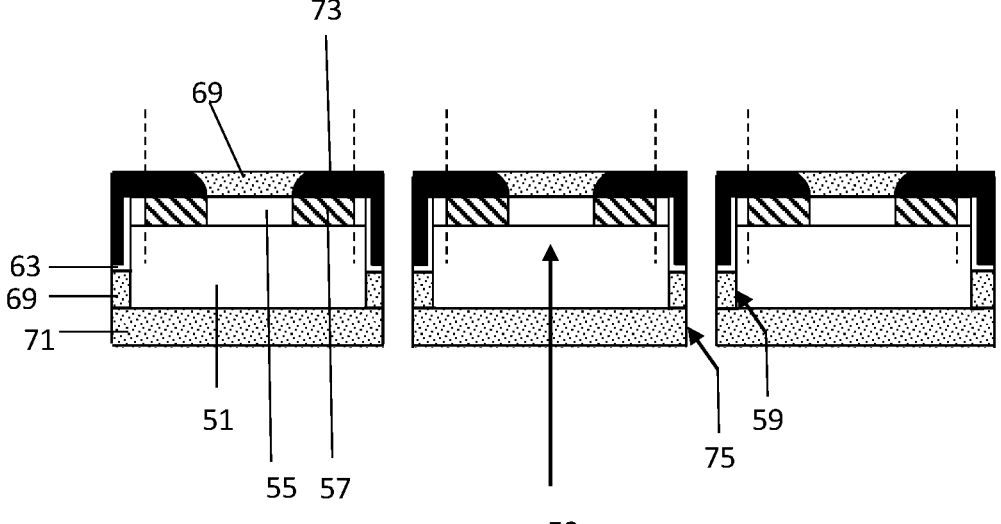
FIG. 29 illustrates, by means of a cross-sectional view, yet another step of an example of a method for manufacturing the electronic chip illustrated in FIG. 16.

FIG. 29 illustrates, by means of a cross-sectional view a step i2) of forming trenches 75 from the front face of the structure obtained from the steps of FIGS. 16 to 28.

More particularly, this step corresponds to a step of cutting the structure into individual chips each comprising a single integrated circuit 53.

According to the embodiment illustrated in FIG. 29, the trenches 75 are formed at the openings 59. The trenches 75 may, for example, when viewed from above, form a continuous grid extending between the integrated circuits 53. The trenches 75 extend, vertically, through the entire thickness of the structure and more particularly through the metal contacts 73 and the layers 69 and 71.

The trenches 75 are, for example, made by sawing.

The trenches 75 thus allow the metal contacts 73 to be separated into two, preferably identical, portions. Each of the two portions of the metal contacts 31 corresponds to a metal contact 73 of a chip. The trenches 75 further allow at least one side of each metal contact 73 of each chip to be exposed.

The width of the trenches 75 is less than the width of the openings 59 so that, after formation of the trenches 75, each integrated circuit 53, and therefore each chip 5, remains covered by the resin 69 or 71 on all of its faces except for the metal contacts 73 forming the side-wettable flanks of the chip.

The step illustrated in FIG. 29 is, for example, preceded by a step of transferring the structure obtained at the end of the steps of FIGS. 16 to 28, preferably by its rear face, onto a support film allowing the chips to be held together. The chips can then be picked up from the support film.

On completion of this step, the structure obtained corresponds to a plurality of electronic chips. The flanks of the metal contacts 73 exposed in this step correspond to wettable flanks of the chips.

One advantage of the described embodiments and methods of implementation is that they allow the height of the metal contacts of the side-wettable flank chips to be integrated into the thickness of the substrate.

Another advantage of the described embodiments and methods of implementation is that they allow for a reduction in the thickness of the wettable flank chips and, therefore, the thickness of the printed circuit boards.

One advantage of the embodiments and methods of implementation described in FIGS. 16-29 is that they allow for the manufacture of cubic or cube-shaped chips.

Another advantage of the embodiments and methods of implementation described in FIGS. 16 to 29 is that they eliminate the need for a step in the wettable flanks of the chip, the said step could be of hindrance to visual inspection of the solder when mounting the chips on a printed circuit board.

Various embodiments and variants have been described. Those skilled in the art will understand that certain features of these embodiments can be combined and other variants will readily occur to those skilled in the art. In particular, the described embodiments are not limited to the above mentioned examples of dimensions and materials.

Finally, the practical implementation of the embodiments and variants described herein is within the capabilities of those skilled in the art based on the functional description provided hereinabove.

An electronic chip (1; 5) may be summarized as including a semiconductor substrate (11; 51) carrying at least one metal contact (31; 73) extending, within the thickness of the substrate, along at least one flank of the chip.

A method for manufacturing an electronic chip (1; 5) may be summarized as including at least one step of forming at least one metal contact (31; 73) extending, within the thickness of a semiconductor substrate (11; 51), along at least one flank of the chip.

The metal contact (31; 73) may be flush with an upper face of the chip (1; 5), the said face being flat.

The chip (1; 5) may be only covered with the metal contact(s) (31; 73) and an insulating protective resin(s) (33, 35; 69, 71).

The metal contact (31; 73) may extend along at least one flank of the chip (1; 5) over a height of between 50 μm and 200 μm, preferably of the order of 100 μm.

The metal contacts (31; 73) may be of a tin-based alloy.

A lower face of the substrate (11; 51) may be coated with an electrically insulating protective resin (35; 71).

The metal contact (31; 73) may be, within the thickness of the substrate (11; 51), separated from the substrate by an insulation layer (21; 63).

The chip (1) may present the shape of a parallelepiped comprising, at least at the level of the metal contacts, a shoulder in the height of the chip.

The metal contact (31; 73) may extend continuously over at least a portion of an upper face of the chip (1; 5), over at least a portion of a side face of the chip, and over at least a portion of a face of the shoulder, parallel to the upper face.

The method may include at least the following steps: a1) forming, on the side of an upper face of the semiconductor substrate (11), in and on which a plurality of integrated circuits (13) have been previously formed, the first openings (19) laterally separating the integrated circuits (13); b1) depositing, in the first openings (19) and on a portion of the upper face of the substrate (11), a layer (23) of a metallic material; c1) forming, in line with the metal layer (23), bumps (25), the bumps covering the metal layer (23) and at least two metal contact connection pads (17) of two adjacent integrated circuits (13) formed in the same substrate (11); d1) forming, from the upper face of the substrate (11), first trenches (29) as to individualize each integrated circuit (13), the first trenches (29) intersecting the bumps (25) and extending over a width less than or equal to the width of the first openings (19) and over a depth greater than the depth of the first openings (19); e1) depositing an electrically insulating protective resin (33) in the first trenches (29) and over the entire upper face of the substrate; f1) thinning the substrate (11) by its upper face so as to remove a part of the protective insulating resin (33) and a part of the bumps (25); g1) thinning the substrate (11) from its lower face until reaching the protective insulating resin (33) located at the bottom of the first trenches (29); h1) forming second openings (37) from the upper face of the substrate (11) in line with the first openings (19); and i1) cutting the protective resin (33) in line with the first trenches (29), so as to separate the integrated circuits (13) into individual chips (1) with a width less than the width of the first trenches (29).

In step h1), what remains of the bumps (25) and the metal layer (23) may be cut through by the second openings (37) so as to form the metal contacts (31).

In step b1) the metal layer (23) may be molded into the first openings (19).

The filling of the first openings with the metal layer in step b1) may be performed by an electroplating method.

The first openings (19) and the second openings (37) may be made by laser ablation or sawing.

The chip (5) may include six planar faces organized in a parallelepiped, the chip may include at least one metal contact (73) forming an angle between two consecutive faces of the parallelepiped, the contact (73) extending over a portion of the thickness of the substrate (51).

The method may include the following steps: a2) forming, on the side of an upper face of the semiconductor substrate (51), in and on which a plurality of integrated circuits (53) have been previously formed, first openings (59) laterally separating the integrated circuits (53); b2) depositing, in the first openings (59), a layer of a photosensitive resin (61); c2) forming second openings (62) locally in the photosensitive layer (61) in the first openings (59) over only a portion of the thickness of the photosensitive layer (61); d2) depositing, in the second openings (62), a layer of a metallic material (65); e2) forming, in line with the metal layer (65), bumps (67), the bumps (67) covering the metal layer (65) and at least two contact connection pads (57) of two adjacent integrated circuits (53) formed in the same substrate (51); f2) removing the photosensitive layer (61) throughout the structure and filling the gaps left by a layer of a protective insulating resin (69); g2) thinning the substrate (51) from its upper face so as to remove a portion of the protective insulating resin layer (69) and a part of the bumps (67) so as to form the metal contacts (73); h2) thinning the substrate (5) from its lower face so as to reach the protective insulating resin (69) at the bottom of the first openings (59); and i2) depositing on the lower face of the substrate a further layer of protective insulating resin (71) and cutting the protective insulating resin (69) and the metal contacts (73) opposite the first openings (59) to a width less than the width of the first openings (59), so as to separate the integrated circuits (53) into individual chips (5) and to expose one flank of at least one metal contact (73) of each integrated circuit (53).

The cutting in step i2) may be performed by sawing.

The first openings (59) may be made by laser ablation or sawing.

The second openings (62) may be made by photolithography or by laser ablation.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
a substrate including a first surface, a second surface opposite to the first surface, and a sidewall transverse to the first surface and the second surface;
an interconnect layer on the first surface of the substrate, the interconnect layer including a conductive pad;
an insulating layer is on and covers a first portion of the sidewall of the substrate;
a conductive layer is coupled to the conductive pad at the first surface of the substrate, the conductive layer is on the insulating layer and covers the insulating layer, and the conductive layer is separated from the sidewall of substrate by the insulating layer;
a first resin layer extends from the second surface of the substrate to the insulating layer and is on and covers a second portion of the sidewall of the substrate; and
a second resin layer is on the second surface of the substrate, and
wherein the first resin layer is on the second resin layer.

2. The device of claim 1, wherein the first portion of the sidewall is smaller than the second portion of the sidewall.

3. The device of claim 1, wherein:

the insulating layer includes a first end sidewall substantially coplanar with the second portion of the sidewall of the substrate; and the conductive layer includes a second end sidewall substantially coplanar with the second portion of the sidewall of the substrate and the first end sidewall of the insulating layer.

4. The device of claim 3, wherein the first resin layer covers the first end sidewall of the insulating layer and the second end sidewall of the conductive layer.

5. The device of claim 1, wherein the first portion of the sidewall is offset from the second portion of the sidewall.

6. The device of claim 1, wherein sidewall surfaces of the insulating layer, the conductive layer, the first resin layer, and the second resin layer are substantially coplanar with each other and are spaced apart from the sidewall of the substrate.

7. The device of claim 1, wherein the first resin layer includes a negative photosensitive resin material.

8. The device of claim 1, wherein the first resin layer includes an end surface substantially coplanar and flush with the first surface of the substrate.

9. The device of claim 8, wherein the insulating layer has an L-shape.

10. A device, comprising:

a substrate including a first surface, a second surface opposite to the first surface, and a sidewall transverse to the first surface and the second surface;

an interconnect layer on the first surface of the substrate, the interconnect layer including a conductive pad;

an insulating layer is on and covers a first portion of the sidewall of the substrate and is on and covers a curved portion of the sidewall;

a conductive layer is coupled to the conductive pad at the first surface of the substrate, the conductive layer is on the insulating layer and covers the insulating layer, and the conductive layer is separated from the sidewall of substrate by the insulating layer;

a first resin layer extends from the second surface of the substrate to the insulating layer and is on and covers a second portion of the sidewall of the substrate; and a second resin layer is on the second surface of the substrate, and wherein the curved portion of the sidewall extends from the first portion of the sidewall to the second portion of the sidewall, and wherein the first resin layer is on the second resin layer.

11. The device of claim 10, wherein:

the insulating layer includes a first end sidewall;

the conductive layer includes a second end sidewall; and the first end sidewall and the second end sidewall are coplanar with second portion of the sidewall of the substrate.

12. The device of claim 11, wherein the first resin layer is on and covers the first end sidewall of the insulating layer.

13. The device of claim 12, wherein the first resin layer is on and covers the second end sidewall of the conductive layer.

14. The device of claim 10, wherein the first resin layer includes a first sidewall spaced apart from the substrate, the insulating layer, and the conductive layer, and the second resin layer includes a second sidewall coplanar with the first sidewall.

15. A device, comprising:

a substrate including a first surface, a second surface opposite to the first surface, a J-shaped sidewall that extends from the first surface, and a sidewall that extends from the second surface to the J-shaped sidewall;

an interconnect layer on the first surface of the substrate, the interconnect layer including a conductive pad;

an insulating layer is on and covers the J-shaped sidewall of the substrate;

a conductive layer is coupled to the conductive pad at the first surface of the substrate, the conductive layer is on the insulating layer and covers the insulating layer, and the conductive layer is separated from the J-shaped sidewall of substrate by the insulating layer;

a first resin layer extends from the second surface of the substrate to the conductive layer and is on and covers the sidewall of the substrate; and a second resin layer is on the second surface of the substrate, and wherein the first resin layer is on the second resin layer.

16. The device of claim 15, wherein:

the insulating layer is a J-shaped insulating layer; and the conductive layer is a J-shaped conductive layer.

17. The device of claim 16, wherein:

the insulating layer includes a first end sidewall coplanar with the sidewall of the substrate;

the conductive layer includes a second end sidewall coplanar with the sidewall of the substrate and the first end sidewall.

18. The device of claim 17, wherein:

the first resin layer includes a first external sidewall spaced apart from the first end sidewall of the insulating layer, the second end sidewall of the conductive layer, and the sidewall of the substrate; and the second resin layer includes a second external sidewall that is coplanar with the first external sidewall.

19. The device of claim 15, wherein the first resin layer is on the interconnect layer.

* * * * *